(12) United States Patent
Kim et al.

(10) Patent No.: US 9,793,495 B2
(45) Date of Patent: Oct. 17, 2017

(54) ORGANIC LIGHT-EMITTING DEVICE

(71) Applicant: SAMSUNG DISPLAY CO., LTD., Yongin, Gyeonggi-Do (KR)

(72) Inventors: Seulong Kim, Yongin (KR); Younsun Kim, Yongin (KR); Dongwoo Shin, Yongin (KR); Jungsub Lee, Yongin (KR); Naoyuki Ito, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 293 days.

(21) Appl. No.: 14/634,096

(22) Filed: Feb. 27, 2015

(65) Prior Publication Data
US 2016/0049593 A1    Feb. 18, 2016

(30) Foreign Application Priority Data
Aug. 13, 2014    (KR) ........................ 10-2014-0105427

(51) Int. Cl.
*H01L 51/00*    (2006.01)
*H01L 51/50*    (2006.01)

(52) U.S. Cl.
CPC ...... *H01L 51/0072* (2013.01); *H01L 51/0058* (2013.01); *H01L 51/0074* (2013.01);
(Continued)

(58) Field of Classification Search
None
See application file for complete search history.

(56) References Cited

U.S. PATENT DOCUMENTS 8,912,531 B2 *   12/2014   Ogiwara ............. H01L 51/0057
                                                                        257/40
2006/0055305 A1    3/2006   Funahashi et al.
(Continued)

FOREIGN PATENT DOCUMENTS

KR          10-1009784 B1    1/2011
KR    10-2013-0007873 A    1/2013
(Continued)

OTHER PUBLICATIONS

Kido et al. "Bright organic electroluminescent devices having a metal-doped electron-injecting layer" Applied Physics Letters, 73(20), 1998, 2866-2868.*

(Continued)

*Primary Examiner* — Robert S Loewe
(74) *Attorney, Agent, or Firm* — Lee & Morse, P.C.

(57) ABSTRACT

An OLED device including a first electrode; a second electrode; and an organic layer, the organic layer including an emission layer, a hole transport region between the first electrode and the emission layer, the hole transport region including at least one of a hole transport layer, a hole injection layer, and a buffer layer, and an electron transport region between the emission layer and the second electrode, the electron transport region including at least one of a hole blocking layer, an electron transport layer, and an electron injection layer, wherein the emission layer includes at least one host (H) and at least one phosphorescent dopant (D), an electron affinity (EA) and an ionization potential (IP) simultaneously satisfying the relationships represented by Equation (1) and Equation (2) below:

$$EA(D)-EA(H) \geq 0.2 \text{ eV} \quad (1)$$

$$IP(H)-IP(D) \geq 0.2 \text{ eV} \quad (2).$$

18 Claims, 1 Drawing Sheet

(52) U.S. Cl.
CPC ...... *H01L 51/5004* (2013.01); *H01L 51/5016* (2013.01); *H01L 51/0054* (2013.01); *H01L 51/0067* (2013.01); *H01L 51/0077* (2013.01); *H01L 51/0081* (2013.01); *H01L 51/0085* (2013.01); *H01L 51/5056* (2013.01); *H01L 51/5072* (2013.01); *H01L 2251/308* (2013.01)

(56) References Cited

U.S. PATENT DOCUMENTS

| | | |
|---|---|---|
| 2006/0158102 A1 | 7/2006 | Kawamura et al. |
| 2010/0231123 A1* | 9/2010 | Otsu ................. C09K 11/06 313/504 |
| 2011/0291082 A1 | 12/2011 | Terao et al. |
| 2012/0068168 A1* | 3/2012 | Lee ..................... C07F 9/5728 257/40 |
| 2012/0172556 A1* | 7/2012 | Zhang ................ C07D 413/10 526/259 |
| 2012/0261653 A1* | 10/2012 | Okamoto ............ H01L 51/5004 257/40 |
| 2013/0001541 A1* | 1/2013 | Hayashi ............. C09K 11/06 257/40 |
| 2013/0015489 A1 | 1/2013 | Song et al. |
| 2013/0168663 A1 | 7/2013 | Gerhard et al. |
| 2014/0135530 A1* | 5/2014 | Zhang ................ C07F 9/5045 568/15 |
| 2014/0197389 A1* | 7/2014 | Adamovich ........ H01L 51/5028 257/40 |
| 2014/0239285 A1* | 8/2014 | Wang ................. H01L 51/504 257/40 |

FOREIGN PATENT DOCUMENTS

| | | |
|---|---|---|
| KR | 10-1232530 B1 | 2/2013 |
| KR | 10-2013-0097740 A | 9/2013 |
| KR | 10-1345613 B1 | 12/2013 |

OTHER PUBLICATIONS

Tokito et al. "Confinement of triplet energy on phosphorescent molecules for highly-efficient organic blue-light-emitting devices" Applied Physics Letters, 83(3), 2003, 569-571.*

Lee et al. "Effects of triplet energies and transporting properties of carrier transporting materials on blue phosphorescent organic light emitting devices" Applied Physics Letters, 93, 123306, 2008, 3 pages.*

Sasabe et al. "3,3-Bicarbazole-Based Host Materials for High-Efficiency Blue Phosphorescent OLEDs with Extremely Low Driving Voltage" Adv. Mater. 2012, 24, 3212-3217.*

Tsai et al. "Highly Efficient Organic Blue Electrophosphorescent Devices Based on 3,6-Bis(triphenylsilyl)carbazole as the Host Material" Adv. Mater. 2006, 18, 1216-1220.*

Xiao et al. "Recent Progresses on Materials for Electrophosphorescent Organic Light-Emitting Devices" Adv. Mater. 2011, 23, 926-952.*

* cited by examiner

10

| 190 |
|-----|
| 150 |
| 110 |

ORGANIC LIGHT-EMITTING DEVICE

CROSS-REFERENCE TO RELATED APPLICATION

Korean Patent Application No. 10-2014-0105427, filed on Aug. 13, 2014, in the Korean Intellectual Property Office, and entitled: "Organic Light-Emitting Device," is incorporated by reference herein in its entirety.

BACKGROUND

1. Field

Embodiments relate to an organic light-emitting device.

2. Description of the Related Art

Organic light-emitting devices are self-emission devices that have wide viewing angles, high contrast ratios, short response time, and excellent brightness, driving voltage, and response speed characteristics, and produce multi-colored images.

The organic light-emitting device may have a structure including a first electrode on a substrate, and a hole transport region, an emission layer, an electron transport region, and a second electrode, which are sequentially stacked on the first electrode. Holes provided from the first electrode may move toward the emission layer through the hole transport region, and electrons provided from the second electrode may move toward the emission layer through the electron transport region. Carriers, such as holes and electrons, may be recombined in the emission layer to produce excitons. These excitons may change from an excited state to a ground state, thereby generating light.

SUMMARY

Embodiments are directed to an organic light-emitting device.

The embodiments may be realized by providing an organic light-emitting device including a first electrode; a second electrode facing the first electrode; and an organic layer between the first electrode and the second electrode, the organic layer including an emission layer, a hole transport region between the first electrode and the emission layer, the hole transport region including at least one of a hole transport layer, a hole injection layer, and a buffer layer, and an electron transport region between the emission layer and the second electrode, the electron transport region including at least one of a hole blocking layer, an electron transport layer, and an electron injection layer, wherein the emission layer includes at least one host (H) and at least one phosphorescent dopant (D), an electron affinity (EA) and an ionization potential (IP) simultaneously satisfying the relationships represented by Equation (1) and Equation (2) below:

$$EA(D)-EA(H) \geq 0.2 \text{ eV} \tag{1}$$

$$IP(H)-IP(D) \geq 0.2 \text{ eV} \tag{2}$$

wherein the hole transport region and the electron transport region each include a layer that is adjacent to the emission layer and that includes a material having a triplet energy ($T_1$) that is greater than that of the phosphorescent dopant.

The layer adjacent to the emission layer and including the material having the triplet energy that is greater than that of the phosphorescent dopant may be a hole transport layer.

The layer adjacent to the emission layer and including the material having the triplet energy that is greater than that of the phosphorescent dopant may be an electron transport layer.

The material having the triplet energy that is greater than that of the phosphorescent dopant may include a carbazole moiety and may be included in a hole transport layer.

The material having the triplet energy that is greater than that of the phosphorescent dopant may include a carbazole moiety and may be included in an electron transport layer.

The host (H) and the phosphorescent dopant (D) of the emission layer may have a triplet energy ($T_1$) that satisfies a relationship represented by Equation (3) below:

$$T_1(D)-T_1(H) \leq 0.3 \text{ eV} \tag{3}$$

The host (H) of the emission layer may have an electron affinity EA and an ionization potential (IP) satisfying a relationship represented by Equation (4) below:

$$IP(H)-EA(H) \leq 3.8 \text{ eV} \tag{4}$$

The host of the emission layer may be a compound represented by Formula 1 below:

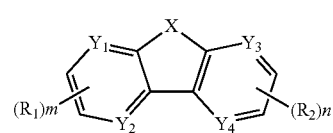

<Formula 1> wherein, in Formula 1, X is selected from $CR_3R_4$, $NR_5$, S, and O, $Y_1$ to $Y_4$ are each independently selected from $CR_6$ and N, $R_1$ to $R_6$ are each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_2$-$C_{60}$ heteroaryl group, a substituted or unsubstituted monovalent non-aromatic condensed polycyclic group, and a substituted or unsubstituted monovalent non-aromatic condensed heteropolycyclic group; at least one substituent of the substituted $C_1$-$C_{60}$ alkyl group, the substituted $C_3$-$C_{10}$ cycloalkyl group, the substituted $C_2$-$C_{10}$ heterocycloalkyl group, the substituted $C_3$-$C_{10}$ cycloalkenyl group, the substituted $C_2$-$C_{10}$ heterocycloalkenyl group, the substituted $C_6$-$C_{60}$ aryl group, the substituted $C_2$-$C_{60}$ heteroaryl group, the substituted monovalent non-aromatic condensed polycyclic group, and the substituted monovalent non-aromatic condensed heteropolycyclic group is selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group; a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, a monovalent non-aromatic condensed heteropolycyclic group, —$N(Q_{11})(Q_{12})$, —Si(Q$_{13}$)(Q$_{14}$)(Q$_{15}$), and —B(Q$_{16}$)(Q$_{17}$); a C$_3$-C$_{10}$ cycloalkyl group, a C$_2$-C$_{10}$ heterocycloalkyl group, a C$_3$-C$_{10}$ cycloalkenyl group, a C$_2$-C$_{10}$ heterocycloalkenyl group, a C$_6$-C$_{60}$ aryl group, a C$_6$-C$_{60}$ aryloxy group, a C$_6$-C$_{60}$ arylthio group, a C$_2$-C$_{60}$ heteroaryl group, a monovalent non-aromatic condensed polycyclic group, and a monovalent non-aromatic condensed heteropolycyclic group; a C$_3$-C$_{10}$ cycloalkyl group, a C$_2$-C$_{10}$ heterocycloalkyl group, a C$_3$-C$_{10}$ cycloalkenyl group, a C$_2$-C$_{10}$ heterocycloalkenyl group, a C$_6$-C$_{60}$ aryl group, a C$_6$-C$_{60}$ aryloxy group, a C$_6$-C$_{60}$ arylthio group, a C$_2$-C$_{60}$ heteroaryl group, a monovalent non-aromatic condensed polycyclic group, and a monovalent non-aromatic condensed heteropolycyclic group, each substituted with at least one of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a C$_1$-C$_{60}$ alkyl group, a C$_2$-C$_{60}$ alkenyl group, a C$_2$-C$_{60}$ alkynyl group, a C$_1$-C$_{60}$ alkoxy group, a C$_3$-C$_{10}$ cycloalkyl group, a C$_2$-C$_{10}$ heterocycloalkyl group, a C$_3$-C$_{10}$ cycloalkenyl group, a C$_2$-C$_{10}$ heterocycloalkenyl group, a C$_6$-C$_{60}$ aryl group, a C$_6$-C$_{60}$ aryloxy group, a C$_6$-C$_{60}$ arylthio group, a C$_2$-C$_{60}$ heteroaryl group, a monovalent non-aromatic condensed polycyclic group, a monovalent non-aromatic condensed heteropolycyclic group, —N(Q$_{21}$)(Q$_{22}$), —Si(Q$_{23}$)(Q$_{24}$)(Q$_{25}$), and —B(Q$_{26}$)(Q$_{27}$); and —N(Q$_{31}$)(Q$_{32}$), —Si(Q$_{33}$)(Q$_{34}$)(Q$_{35}$), and —B(Q$_{36}$)(Q$_{37}$), wherein Q$_{11}$ to Q$_{17}$, Q$_{21}$ to Q$_{27}$ and Q$_{31}$ to Q$_{37}$ are each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a C$_1$-C$_{60}$ alkyl group, a C$_2$-C$_{60}$ alkenyl group, a C$_2$-C$_{60}$ alkynyl group, a C$_1$-C$_{60}$ alkoxy group, a C$_3$-C$_{10}$ cycloalkyl group, a C$_2$-C$_{10}$ heterocycloalkyl group, a C$_3$-C$_{10}$ cycloalkenyl group, a C$_2$-C$_{10}$ heterocycloalkenyl group, a C$_6$-C$_{60}$ aryl group, a C$_2$-C$_{60}$ heteroaryl group, a monovalent non-aromatic condensed polycyclic group, and a monovalent non-aromatic condensed heteropolycyclic group, and m and n are each independently integers of 1 to 4, and in the case of m or n being 2 or more, the 2 or more of R$_1$ or R$_2$ are identical to or different from each other.

Adjacent substituents or ones of R$_1$ and R$_2$ may be bound to each other to form a ring.

A host material in the emission layer may include any one of the following Compounds PH1 to PH7:

PH1

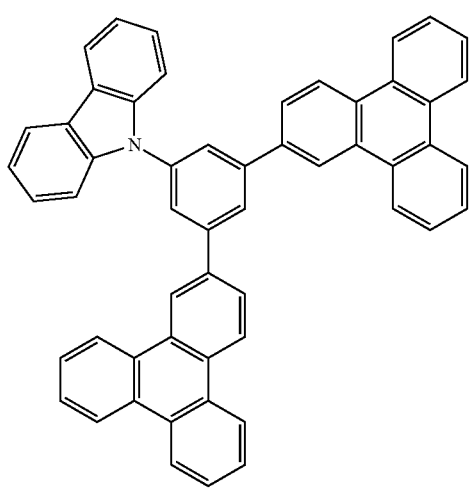

PH2

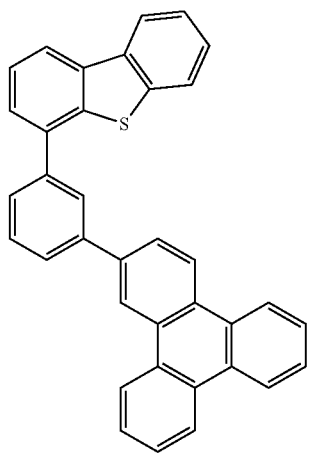

PH3

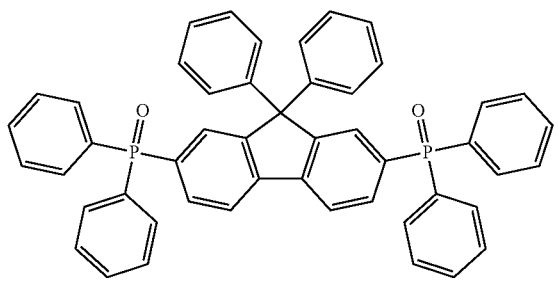

PH4

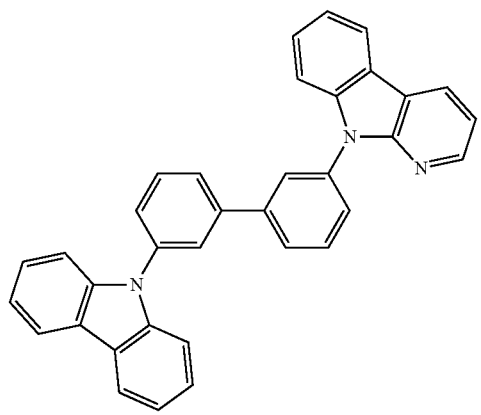

PH5

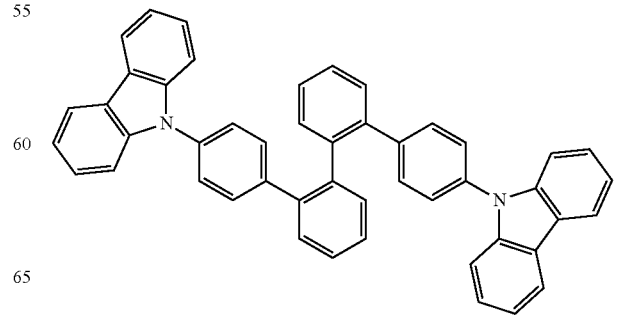

-continued

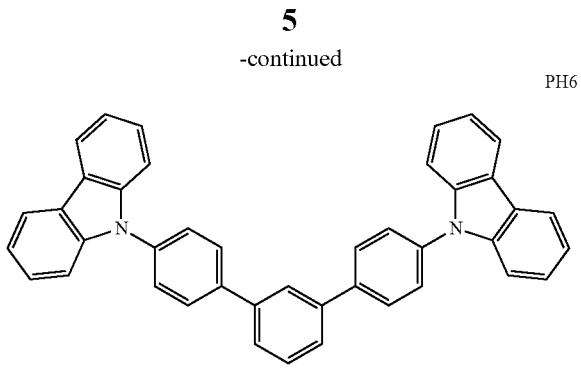

PH6

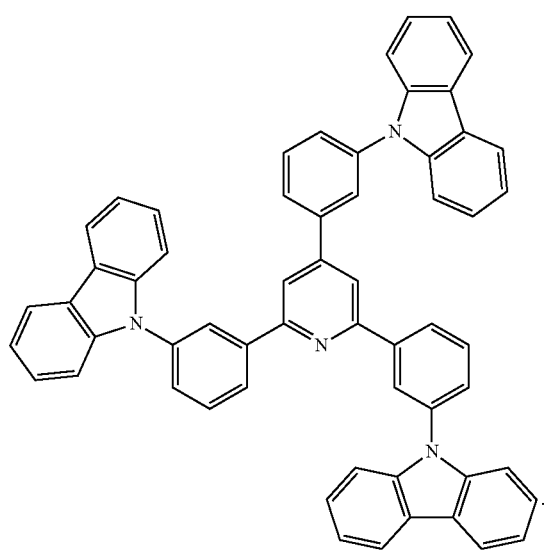

PH7

The dopant in the emission layer may include an iridium complex.

The dopant in the emission layer may include any one of the following compounds:

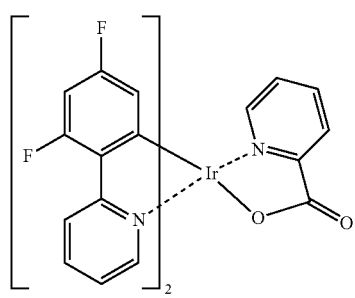

FIrpic

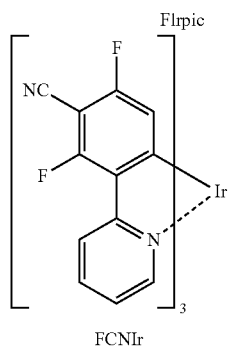

FCNIr

FCNIrpic

The material having the triplet energy that is greater than that of the phosphorescent dopant may be included in a hole transport layer and may be represented by Formula 2 below:

<Formula 2>

$$R_1\text{-}N(R_2)\text{-}L\text{-}(R_3)_n\text{-}R_4$$

wherein, in Formula 2, $R_1$, $R_2$, and $R_4$ are each independently selected from a hydrogen, a deuterium, —F, —Cl, —Br, —I, a cyano group, a substituted or unsubstituted $C_6$-$C_{60}$ arylamino group, a substituted or unsubstituted $C_1$-$C_{60}$ alkyl group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group; $R_3$ and L are each independently selected from a substituted or unsubstituted $C_3$-$C_{10}$ cycloalkylene group, a substituted or unsubstituted $C_2$-$C_{10}$ heterocycloalkylene group, a substituted or unsubstituted $C_3$-$C_{10}$ cycloalkenylene group, a substituted or unsubstituted $C_2$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group; adjacent substituents or ones of $R_1$ to $R_4$ are separate or are bonded to each other to form a ring; and n is an integer of 1 to 3, and in the case of n being 2 or greater, each $R_3$ is identical to or different from each other.

The material having the triplet energy that is greater than that of the phosphorescent dopant may be included in an electron transport layer and may be represented by any one of Formulae 3 and 4:

$$(A_{21})_{n21}\text{-}(A_{22})_{n22}\text{-}(A_{23})_{n23}\text{-}(A_{24})_{n24}$$ <Formula 3> wherein, in Formula 3, $A_{21}$ and $A_{24}$ are each independently selected from a substituted or unsubstituted $C_6$-$C_{60}$ aryl group and a substituted or unsubstituted $C_1$-$C_{60}$ heteroaryl group; $A_{22}$ and $A_{23}$ are each independently from a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group; at least one of $A_{21}$ to $A_{24}$ is selected from a substituted or unsubstituted nitrogen atom-containing $C_1$-$C_{60}$ heteroaryl or heteroarylene group; n21 to n24 are each independently selected from 0, 1, 2, and 3; and a sum of n21, n22, n23, and n24 is 4 or greater, <Formula 4>

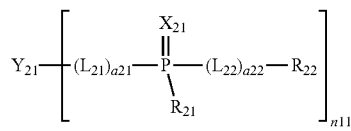

wherein, in Formula 4, $L_{21}$ and $L_{22}$ are each independently selected from a substituted or unsubstituted alkylene group, a substituted or unsubstituted silylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group; a21 and a22 are each independently integers selected from 0 to 3, and in the case of a21 or a22 being 2 or greater, each of $L_{21}$ or $L_{22}$ are identical to or different from each other; $R_{21}$ and $R_{22}$ are each independently selected from a hydrogen, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group; $X_{21}$ is selected from an oxygen atom, a sulfur atom, and a selenium atom; $Y_{21}$ is a single bond, a substituted or unsubstituted $C_6$-$C_{60}$ aryl group, a substituted or unsubstituted $C_6$-$C_{60}$ arylene group, a substituted or unsubstituted $C_1$-$C_{60}$ heteroaryl group, and a substituted or unsubstituted $C_1$-$C_{60}$ heteroarylene group; and n11 is selected from 1, 2, and 3.

The material having the triplet energy that is greater than that of the phosphorescent dopant may be included in a hole transport layer and may be one of Compound HT1 or Compound HT2, below:

HT1

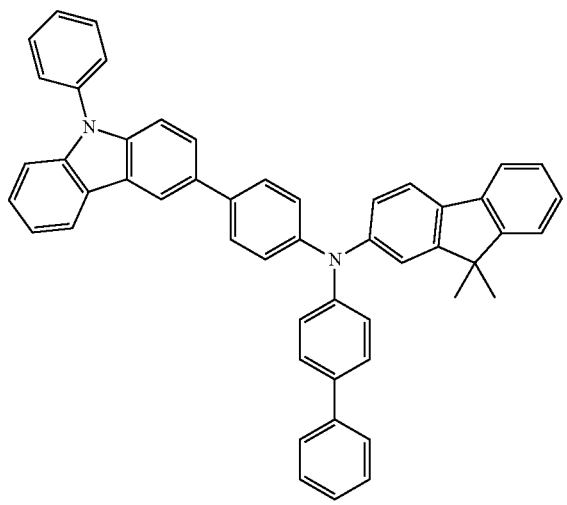

HT2

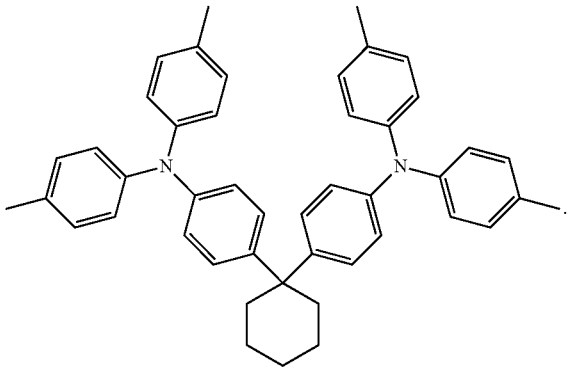

The material having the triplet energy that is greater than that of the phosphorescent dopant may be included in an electron transport layer and may be one of Compound ET1 or Compound ET2, below:

ET1

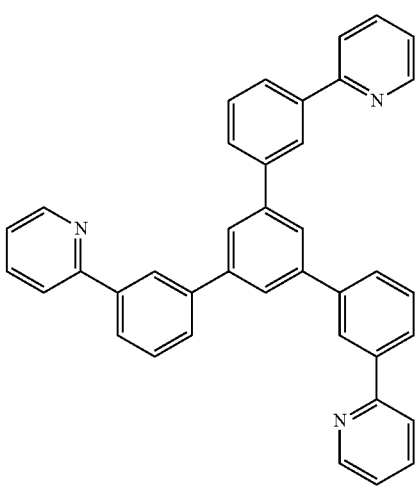

ET2

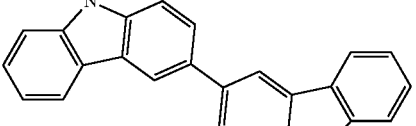
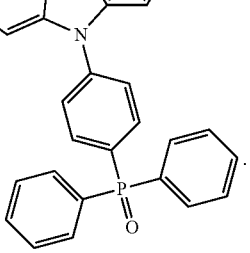

The electron transport region may include a metal complex.

The metal complex may include a lithium complex.

The organic layer may be formed by a wet process.

The embodiments may be realized by providing a flat display apparatus including a source electrode; a drain electrode; and the organic light-emitting device according to an embodiment, wherein the first electrode of the organic light-emitting device is electrically connected to the source electrode or the drain electrode.

BRIEF DESCRIPTION OF THE DRAWING

Features will become apparent to those of ordinary skill in the art by describing in detail exemplary embodiments with reference to the attached drawing in which:

FIG. 1 illustrates a schematic view of an organic light-emitting device according to an embodiment.

DETAILED DESCRIPTION

Example embodiments will now be described more fully hereinafter with reference to the accompanying drawing; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing FIGURE, the dimensions of layers and regions may be exaggerated for clarity of illustration. Like reference numerals refer to like elements throughout.

As used herein, the term "and/or" includes any and all combinations of one or more of the associated listed items. Expressions such as "at least one of" when preceding a list of elements, modify the entire list of elements and do not modify the individual elements of the list.

According to an embodiment, an organic light-emitting device may include a first electrode; a second electrode facing the first electrode; and an organic layer between the first electrode and the second electrode and including an emission layer.

The organic layer may include i) a hole transport region that is between the first electrode and the emission layer and that includes at least one of a hole transport layer, a hole injection layer, and a buffer layer, and ii) an electron transport region that is between the emission layer and the second electrode and that includes at least one of a hole blocking layer, an electron transport layer, and an electron injection layer, The emission layer may include, e.g., as a material for forming the same, at least one host (H) and at least one phosphorescent dopant (D) of which an electron affinity (EA), and an ionization potential (IP) simultaneously satisfy relationships represented by Equations (1) and (2) below.

$EA(D)-EA(H) \geq 0.2$ eV  (1)

$IP(H)-IP(D) \geq 0.2$ eV  (2)

In an implementation, the hole transport region and/or the electron transport region may include a layer that is adjacent to the emission layer and that includes a material having a triplet energy ($T_1$) that is greater than that of the phosphorescent dopant D.

For example, the triplet energy $T_1$ of the host H and/or the phosphorescent dopant D in the emission layer may satisfy the following relationship.

$T_1(H) \leq T_1(D)$

When the host and the dopant have an ionization potential IP and an electron affinity EA satisfied according to the relationships above, the holes and the electrons may be directly injected to the dopant without passing through the host. Here, the holes and the electrons may not be injected to the host that has a relatively high injection barrier, and driving voltage of the organic light-emitting device may be decreased.

In addition, the carriers may be directly injected to the dopant, and the host may not need to have a greater triplet energy $T_1$ than that of the dopant. When the host having a slightly low triplet energy $T_1$ (e.g., $T_1 \leq 0.3$ eV, which may be low enough to enable a thermal activated energy transfer at room or ambient temperature, and that is, a triplet energy $T_1$ of the host may be transferred to that of the dopant. Thus, the carriers that are injected may be available. However, when the triplet energy $T_1$ is too low, the energy transfer may not occur, and accordingly the efficiency of the organic light-emitting device may be decreased) is introduced to the organic light-emitting device, a material having a relatively small energy gap compared to other materials may be introduced to the organic light-emitting device, thereby obtaining diversity of materials to be developed.

The layer including a material having a greater triplet energy $T_1$ than that of the phosphorescent dopant and being adjacent to the emission layer may be a hole transport layer and/or an electron transport layer.

The material having a greater triplet energy $T_1$ than that of the phosphorescent dopant may have or include a carbazole framework or moiety, and may be included in the hole transport layer and/or the electron transport layer.

At least one of the hole transport layer and the electron transport layer (that are adjacent to the emission layer) may include a material including a carbazole moiety.

In an implementation, the host H and the phosphorescent dopant D in the emission layer may have a triplet energy $T_1$ satisfying a relationship represented by Equation (3) below.

$T_1(D)-T_1(H) \leq 0.3$ eV  (3)

When the host and the phosphorescent dopant have a triplet energy $T_1$ within this range, a thermal activated energy transfer may occur at ambient temperature, e.g., a triplet energy $T_1$ of the host may be transferred to that of the dopant. In this regard, the carriers injected to the host may become available.

In an implementation, the host H in the emission layer may have an electron affinity EA and an ionization potential IP satisfying a relationship represented by Equation (4) below.

$IP(H)-EA(H) \leq 3.8$ eV  (4)

When the host has an electron affinity EA and an ionization potential IP within this range, a decrease in the carrier injection that is caused by an excessively large Eg (energy gap) may be prevented.

The host in the emission layer may be a compound represented by Formula 1 below.

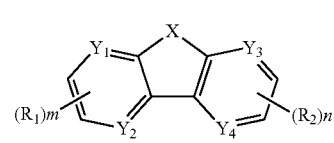

<Formula 1>

In Formula 1,

X may be selected from $CR_3R_4$, $NR_5$, S, and O, $Y_1$ to $Y_4$ may each independently be selected from $CR_6$ and N, $R_1$ to $R_6$ may each independently be selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_2$-$C_{60}$ heteroaryl group, a substituted or unsubstituted monovalent non-aromatic condensed polycyclic group, and a substituted or unsubstituted monovalent non-aromatic condensed heteropolycyclic group;

at least one substituent of the substituted $C_1$-$C_{60}$ alkyl group, the substituted $C_3$-$C_{10}$ cycloalkyl group, the substituted $C_2$-$C_{10}$ heterocycloalkyl group, the substituted $C_3$-$C_{10}$ cycloalkenyl group, the substituted $C_2$-$C_{10}$ heterocycloalkenyl group, the substituted $C_6$-$C_{60}$ aryl group, the substituted $C_2$-$C_{60}$ heteroaryl group, the substituted monovalent non-aromatic condensed polycyclic group, and the substituted monovalent non-aromatic condensed heteropolycyclic group may be selected from:

a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), and —B($Q_{16}$)($Q_{17}$);

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, and a monovalent non-aromatic condensed heteropolycyclic group, each substituted with at least one of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), and —B($Q_{26}$)($Q_{27}$); and —N($Q_{31}$)($Q_{32}$), —Si($Q_{33}$)($Q_{34}$)($Q_{35}$), and —B($Q_{36}$)($Q_{37}$), wherein $Q_{11}$ to $Q_{17}$, $Q_{21}$ to $Q_{27}$, and $Q_{31}$ to $Q_{37}$ may be each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_2$-$C_{60}$ heteroaryl group, a monovalent non-aromatic condensed polycyclic group, and a monovalent non-aromatic condensed heteropolycyclic group, and m and n may each independently be an integer of 1 to 4. In the case of m or n being 2 or more, 2 or more of $R_1$ or $R_2$ may be identical to or different from each other.

In an implementation, adjacent substituents or ones of $R_1$ to $R_2$ may be bound to each other to form a ring (e.g., or may be separate).

In an implementation, the host material in the emission layer may include any one of Compounds PH1 to PH7, below.

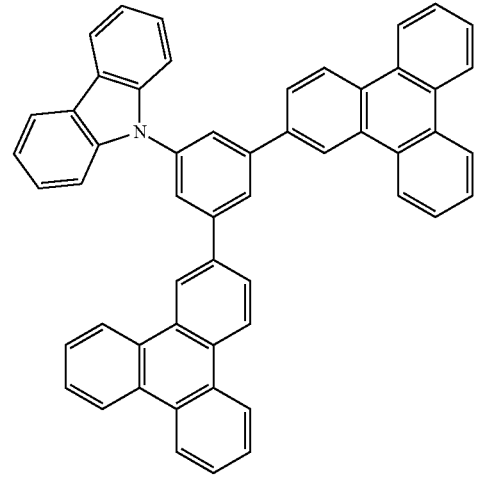

PH1

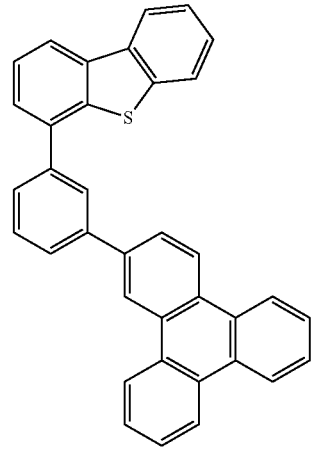

PH2

PH3
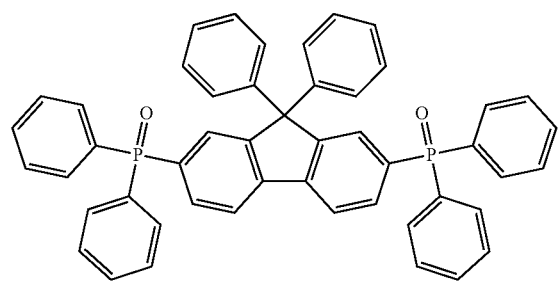
PH4
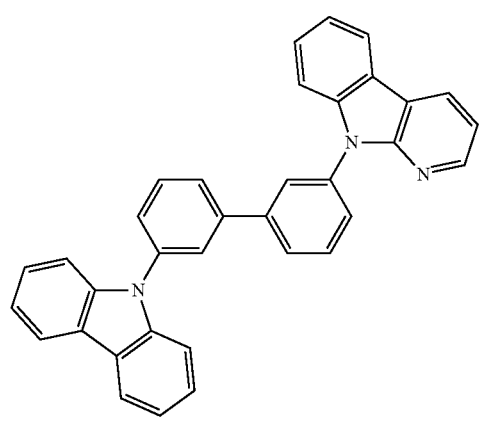
PH5
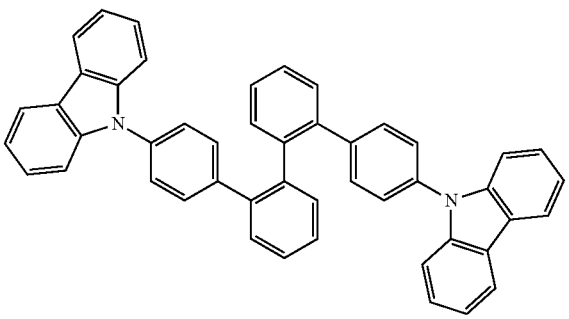
PH6
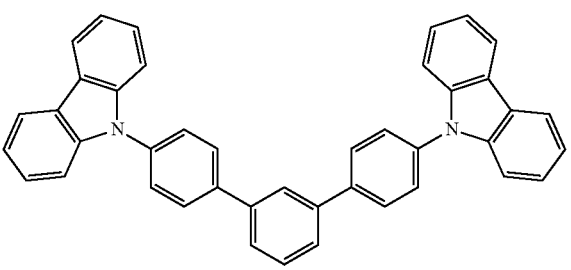
PH7
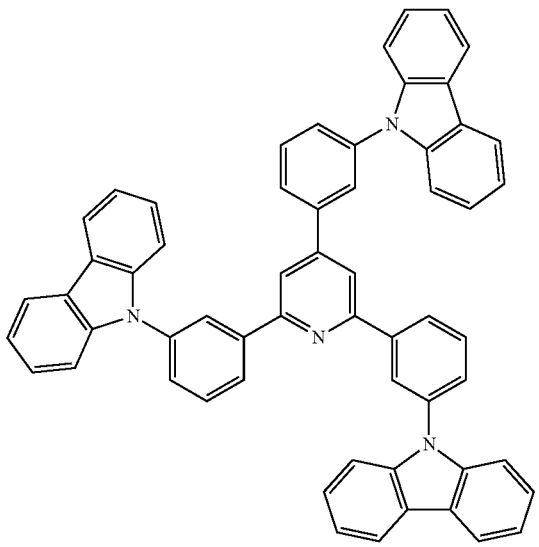
In an implementation, a dopant in the emission layer may include an iridium (Ir) complex.
In an implementation, a dopant in the emission layer may be any one of the compounds or complexes below.
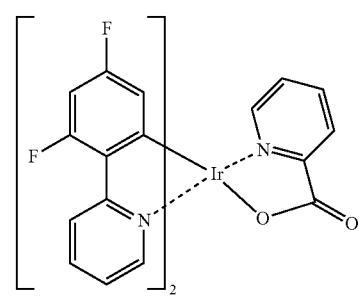
FIrpic
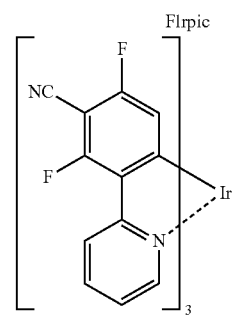
FCNIr
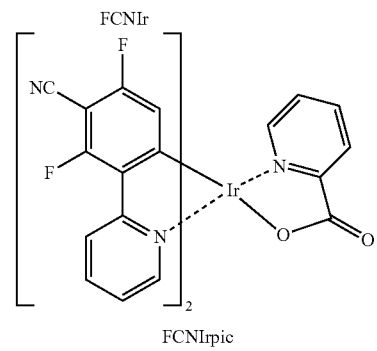
FCNIrpic At least one of the hole transport layer and the electron transport layer (that are adjacent to the emission layer) may include a material including a carbazole moiety, and may further include a compound represented by any one of Formulae 2 to 4 below, in addition to the material including a carbazole moiety.

In an implementation, the material having the triplet energy $T_1$ that is greater than that of a phosphorescent dopant may be included in the hole transport layer, and the material may be a compound represented by Formula 2 below.

<Formula 2>

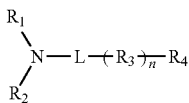

In Formula 2, $R_1$, $R_2$, and $R_4$ may each independently be selected from a hydrogen, a deuterium, —F, —Cl, —Br, —I, a cyano group, a substituted or unsubstituted $C_6$-$C_{60}$ arylamino group, a substituted or unsubstituted $C_1$-$C_{60}$ alkyl group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group; and $R_3$ and L may each independently be selected from a substituted or unsubstituted $C_3$-$C_{10}$ cycloalkylene group, a substituted or unsubstituted $C_2$-$C_{10}$ heterocycloalkylene group, a substituted or unsubstituted $C_3$-$C_{10}$ cycloalkenylene group, a substituted or unsubstituted $C_2$-$C_{10}$ heterocycloalkenylene group, a substituted or unsubstituted $C_6$-$C_{60}$ arylene group, a substituted or unsubstituted heteroarylene group, a substituted or unsubstituted divalent non-aromatic condensed polycyclic group, and a substituted or unsubstituted divalent non-aromatic condensed heteropolycyclic group.

In an implementation, adjacent substituents or ones of $R_1$ to $R_4$ may be bound to each other to form a ring (e.g., or may be separate).

n may be an integer of 1 to 3, and in the case of n being 2 or more, 2 or more of $R_3$ may be identical to or different from each other.

In an implementation, the material having the triplet energy $T_1$ that is greater than that of a phosphorescent dopant may be included in the hole transport layer, and the material may be any one of Compounds HT1 or HT2, below.

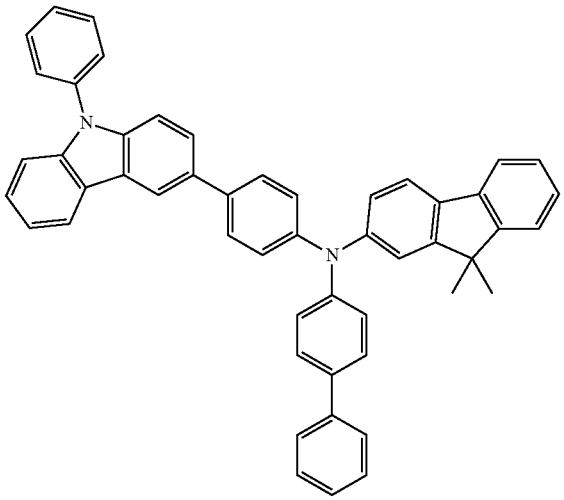

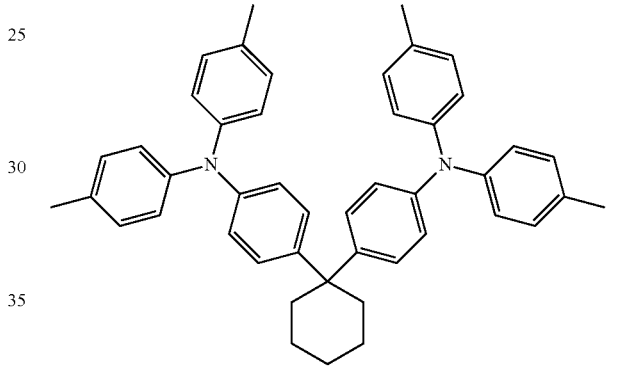

In an implementation, the material having the triplet energy $T_1$ that is greater than that of a phosphorescent dopant may be included in the electron transport layer, and the material may be a compound of any one of Formula 3 or Formula 4, below.

$(A_{21})_{n21}$-$(A_{22})_{n22}$-$(A_{23})_{n23}$-$(A_{24})_{n24}$ <Formula 3>

In Formula 3, $A_{21}$ and $A_{24}$ may each independently be selected from a substituted or unsubstituted $C_6$-$C_{60}$ aryl group and a substituted or unsubstituted $C_1$-$C_{60}$ heteroaryl group; and $A_{22}$ and $A_{23}$ may each independently be selected from a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group.

In an implementation, at least one of $A_{21}$ to $A_{24}$ may be selected from a substituted or unsubstituted, nitrogen atom-containing $C_1$-$C_{60}$ heteroaryl or heteroarylene group;

n21 to n24 may each independently be selected from 0, 1, 2, and 3.

In an implementation, a sum of n21, n22, n23, and n24 may not be 0. In an implementation, the sum of n21, n22, n23, and n24 may be 4 or more.

<Formula 4>

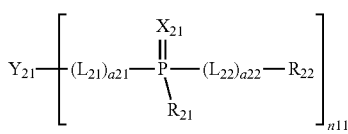

In Formula 4, $L_{21}$ and $L_{22}$ may each independently be selected from a substituted or unsubstituted $C_1$-$C_{10}$ alkylene group, a substituted or unsubstituted silylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group;

a21 and a22 may each independently be selected from 0 to 3, and in the case of a21 or a22 being 2 or more, 2 or more of $L_{21}$ or $L_{22}$ may be identical to or different from each other;

$R_{21}$ and $R_{22}$ may each independently be selected from a hydrogen, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group;

$X_{21}$ may be selected from an oxygen atom, a sulfur atom, and a selenium atom;

$Y_{21}$ may be selected from a single bond, a substituted or unsubstituted $C_6$-$C_{60}$ aryl group, a substituted or unsubstituted $C_6$-$C_{60}$ arylene group, a substituted or unsubstituted $C_1$-$C_{60}$ heteroaryl group, and a substituted or unsubstituted $C_1$-$C_{60}$ heteroarylene group; and n11 may be selected from 1, 2, and 3.

In an implementation, the material having a triplet energy $T_1$ that is greater than that of a phosphorescent dopant may be included in the electron transport layer, and the material may be any one of the following compounds.

ET1

ET2

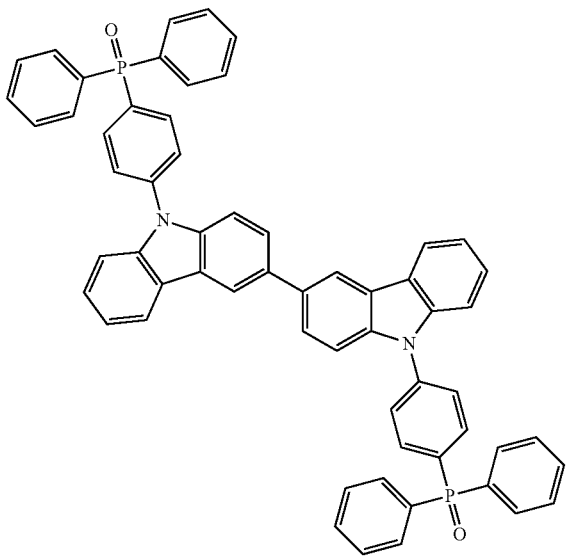

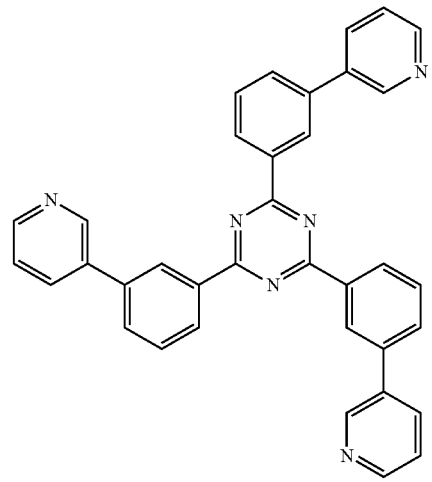

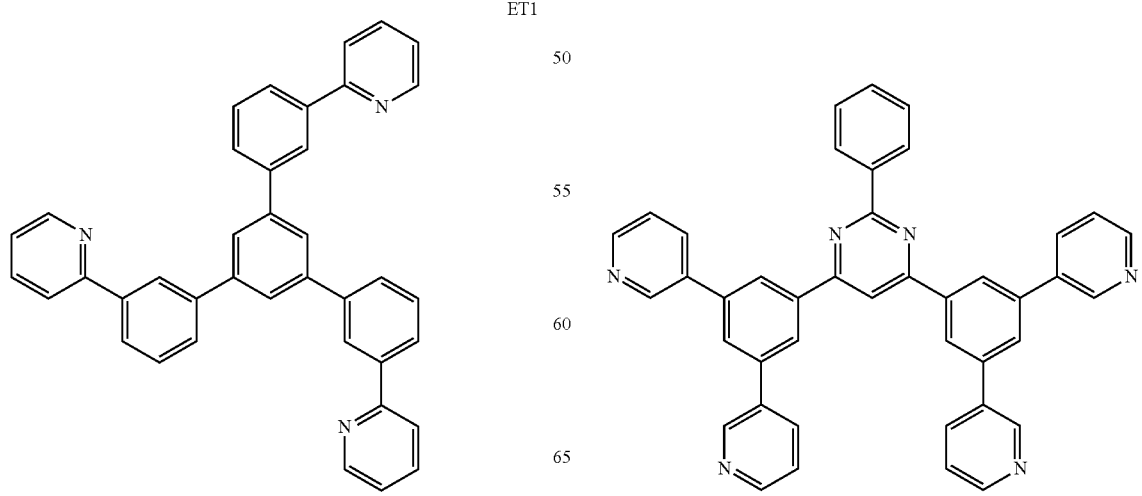

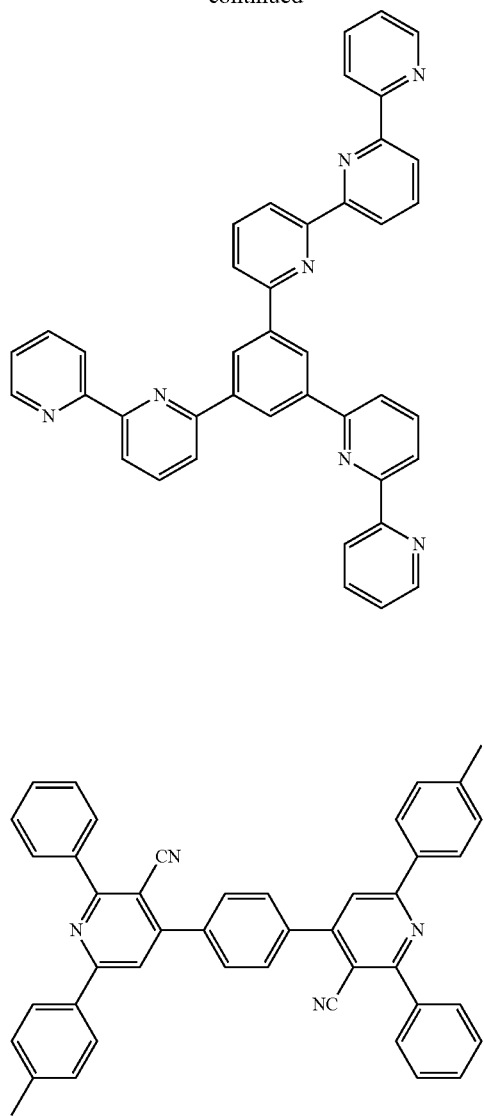
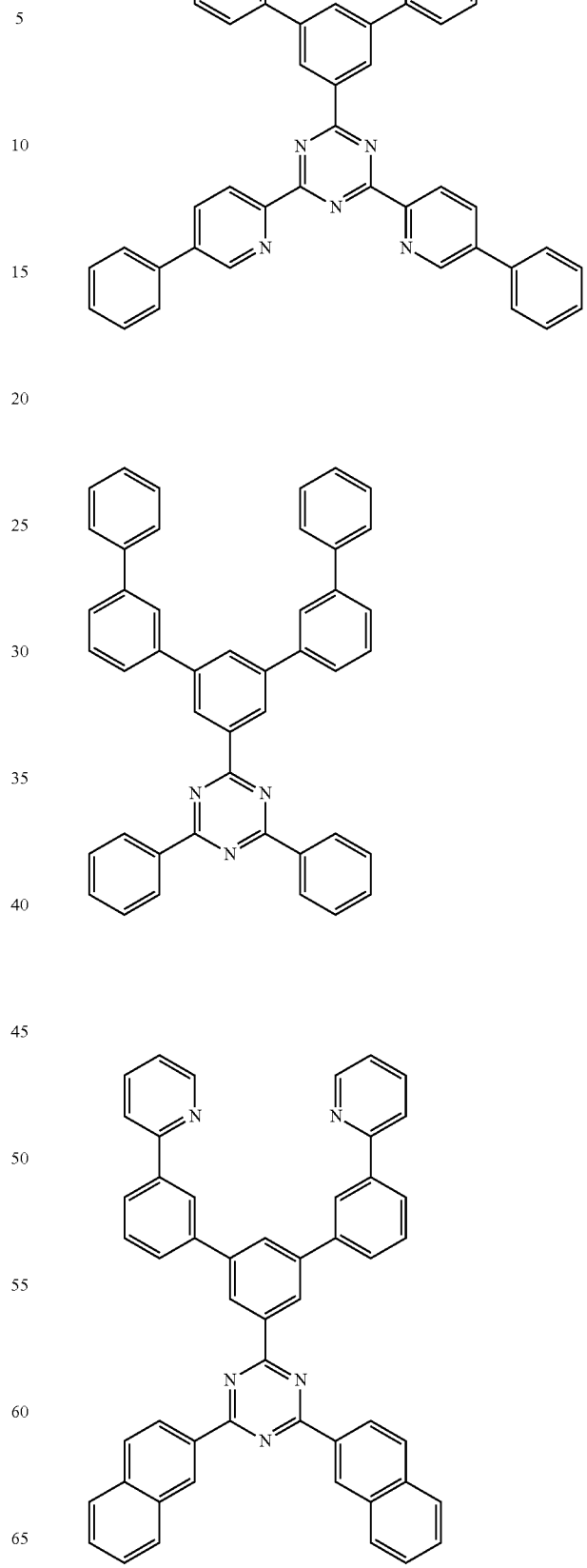

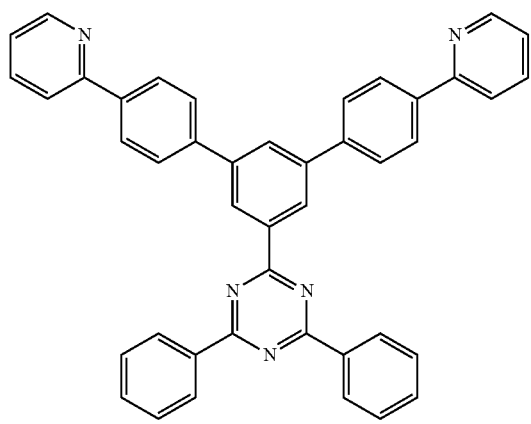
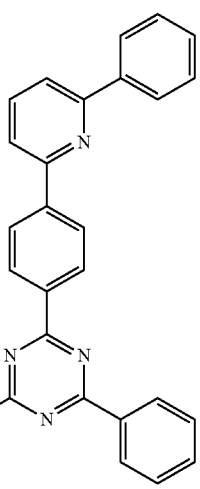
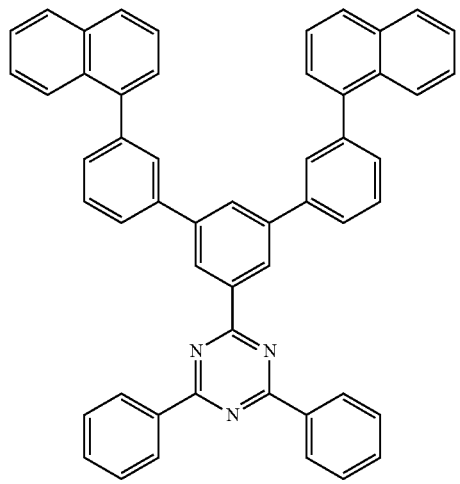
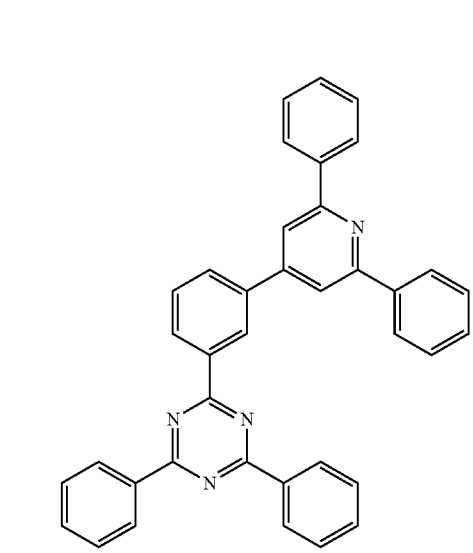
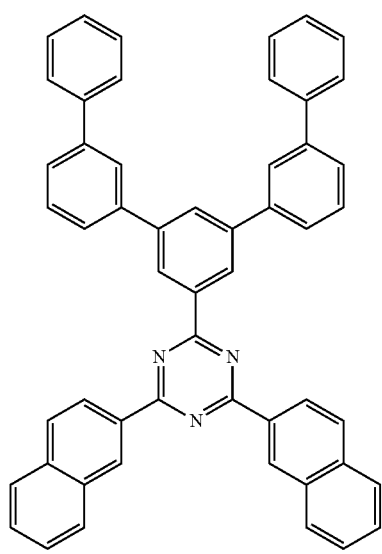
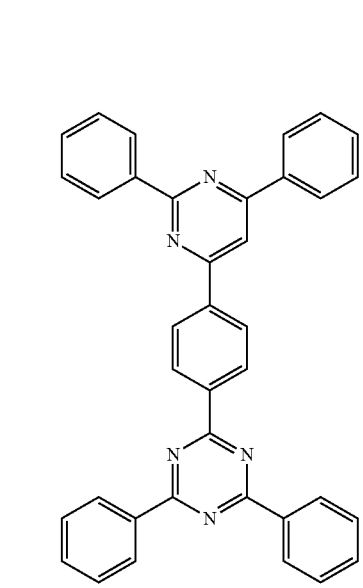

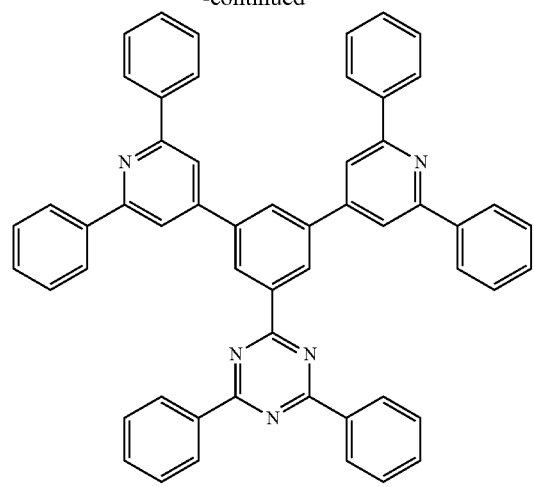
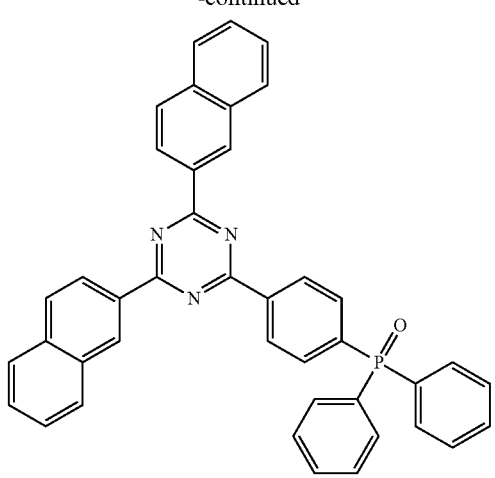
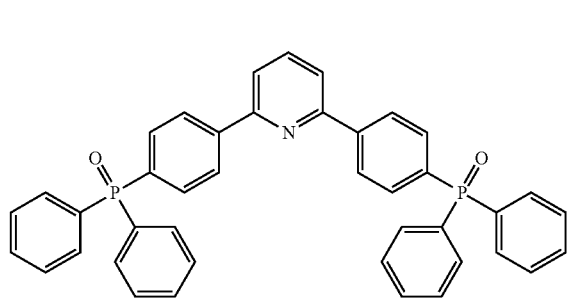
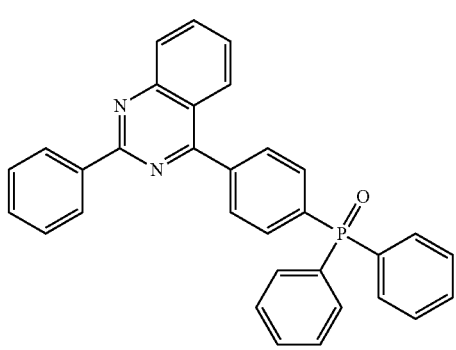
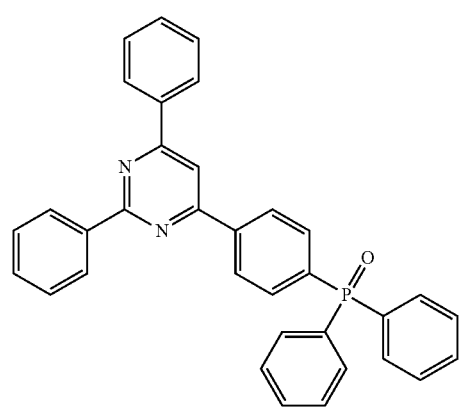
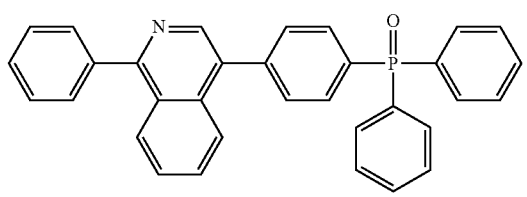
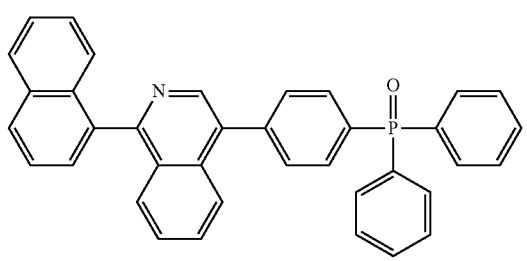
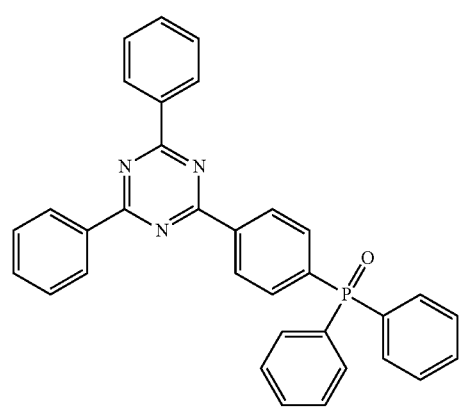
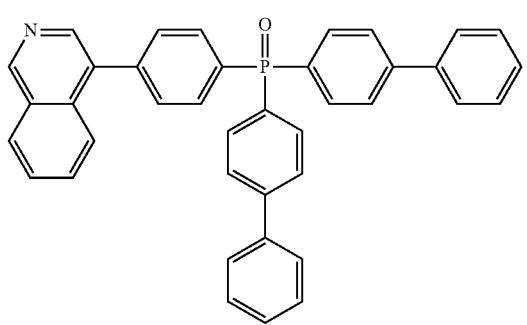

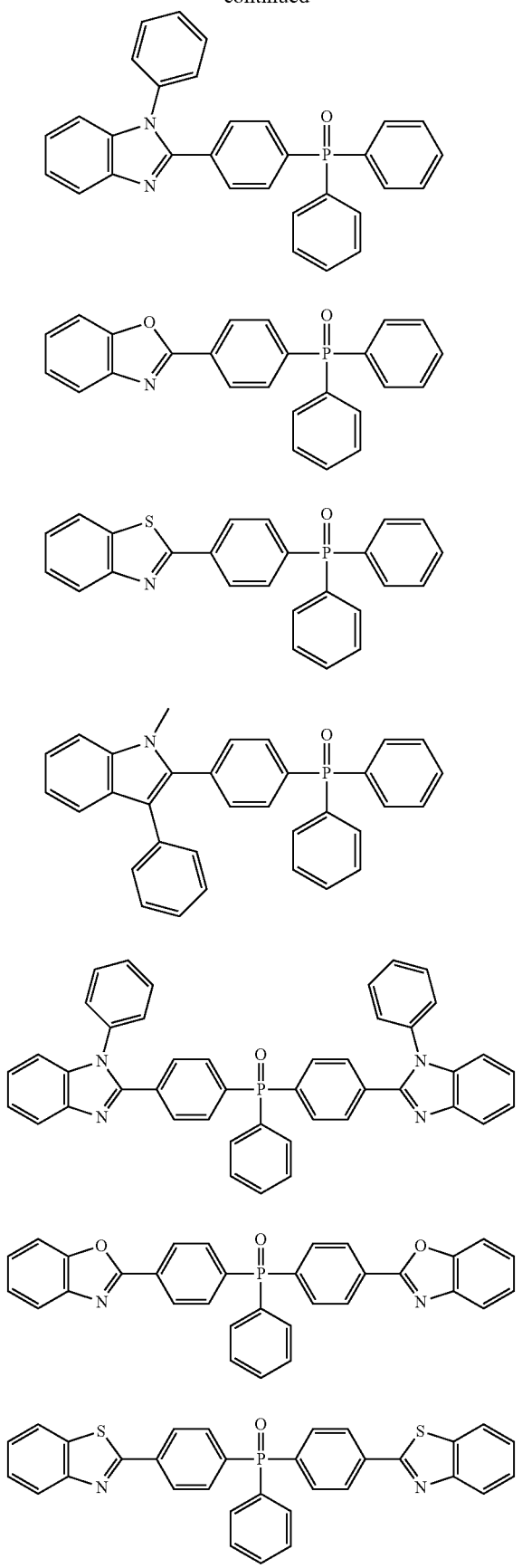

The expression "(an organic layer) includes at least one compound" used herein includes a case in which "(an organic layer) includes one condensed cyclic compound of Formula 1 or a case in which (an organic layer) includes two or more different condensed compounds of Formula 1".

The expression "organic layer" used herein refers to a single layer and/or a plurality of layers disposed between the first electrode and the second electrode of the organic light-emitting device. A material included in the "organic layer" is not limited to an organic material.

FIG. 1 illustrates a schematic view of an organic light-emitting device 10 according to an embodiment. The organic light-emitting device 10 may include a first electrode 110, an organic layer 150, and a second electrode 190.

Hereinafter, a structure of the organic light-emitting device 10 according to an embodiment and a method of manufacturing the organic light-emitting device 10 according to an embodiment will be described in connection with FIG. 1.

In FIG. 1, a substrate may be disposed under the first electrode 110 or on the second electrode 190. The substrate may be a glass substrate or a transparent plastic substrate, each with excellent mechanical strength, thermal stability, transparency, surface smoothness, ease of handling, and water repellency.

The first electrode 110 may be formed by, e.g., depositing or sputtering a material for forming the first electrode 110, on the substrate. When the first electrode 110 is an anode, the material for forming the first electrode 110 may be selected from materials with a high work function to facilitate the hole injection. The first electrode 110 may be, e.g., a reflective electrode, a semi-transparent electrode, or a transparent electrode. The material for forming the first electrode 110 may be a transparent and highly conductive material, and examples thereof include indium tin oxide (ITO), indium zinc oxide (IZO), tin oxide ($SnO_2$), and zinc oxide (ZnO). In an implementation, the material for forming the first electrode 110, which is a semi-transparent electrode or a reflective electrode, may be at least one selected from magnesium (Mg), aluminum (Al), aluminum-lithium (Al—Li), calcium (Ca), magnesium-indium (Mg—In), and magnesium-silver (Mg—Ag).

The first electrode 110 may have a single-layered structure or a multi-layered structure including two or more layers. For example, the first electrode 110 may have a three-layered structure of ITO/Ag/ITO.

The organic layer 150 may be on the first electrode 110. The organic layer 150 may include an emission layer.

The organic layer 150 may further include a hole transport region between the first electrode 110 and the emission layer and an electron transport region between the emission layer and the second electrode 190.

The hole transport region may include at least one of a hole transport layer (HTL), a hole injection layer (HIL), and a buffer layer, and the electron transport region may include at least one of a hole blocking layer (HBL), an electron transport layer (ETL), and an electron injection layer (EIL).

The hole transport region may have a single-layered structure formed of a single material, a single-layered structure formed of a plurality of different materials, or a multi-layered structure having a plurality of layers formed of different materials.

For example, the hole transport region may have a single-layered structure formed of different materials, or a structure of HIL/HTL, a structure of HIL/HTL/buffer layer, a structure of HIL/buffer layer, a structure of HTL/buffer layer, or a structure of HIL/HTL/EBL, wherein layers of each structure are sequentially stacked on the first electrode 110 in this stated order.

When the hole transport region includes the HIL, the HIL may be formed on the first electrode 110 by using various methods, such as vacuum deposition, spin coating, casting, a Langmuir-Blodgett method, an ink-jet printing, a laser-printing, or a laser induced thermal imaging (LITI) method.

When the HIL is formed by vacuum deposition, the deposition may be performed, e.g., at a deposition temperature of about 100° C. to about 500° C., at a vacuum degree of about $10^{-8}$ torr to about $10^{-3}$ torr, and a deposition rate of about 0.01 Å/sec to about 100 Å/sec in consideration of a compound for forming the HIL to be deposited and a structure of the HIL to be formed.

When the HIL is formed by spin coating, the coating may be performed, e.g., at a coating speed of about 2,000 rpm to about 5,000 rpm and at a temperature of about 80° C. to about 200° C., in consideration of a compound for forming the HIL to be deposited and a structure of the HIL to be formed.

When the hole transport region includes the HTL, the HTL may be formed on the first electrode 110 or on the HIL by using various methods, such as vacuum deposition, spin coating, casting, an LB method, an ink-jet printing, a laser-printing, or an LITI method. When the HTL is formed by vacuum deposition and spin coating, the deposition and coating conditions for the HTL may be determined by referring to the deposition and coating conditions for the HIL.

In an implementation, the hole transport region may include a layer including a material that has a triplet energy $T_1$ that is greater than that of a phosphorescent dopant, and the layer may be adjacent to the emission layer. In an implementation, the layer may be, e.g., an HTL.

A thickness of the hole transport region may be about 100 Å to about 10,000 Å, e.g., about 100 Å to about 1,000 Å. When the hole transport region includes both an HIL and an HTL, a thickness of the HIL may be about 100 Å to about 10,000 Å, e.g., about 100 Å to about 1,000 Å, and a thickness of the HTL may be about 50 Å to about 2,000 Å, e.g., about 100 Å to about 1,500 Å. When the thicknesses of the hole transport region, the HIL, and the HTL are within these ranges, satisfactory hole transport characteristics may be obtained without a substantial increase in driving voltage.

The hole transport region may further include, in addition to these materials, a charge-generation material for the improvement of conductivity. The charge-generation material may be homogeneously or non-homogeneously dispersed in the hole transport region.

The charge-generation material may be, e.g., a p-dopant. The p-dopant may include, e.g., one of a quinone derivative, a metal oxide, and a cyano group-containing compound. Examples of the p-dopant may include a quinone derivative, such as tetracyanoquinonedimethane (TCNQ), and 2,3,5,6-tetrafluoro-tetracyano-1,4-benzoquinonedimethane (F4-TCNQ); a metal oxide, such as a tungsten oxide and a molybdenum oxide; and Compound HT-D1 below.

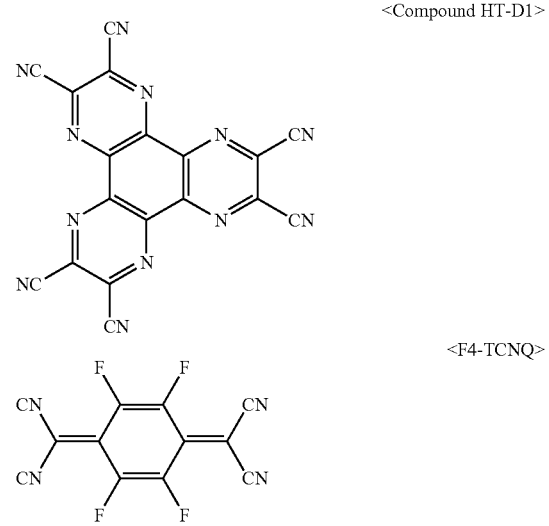

<Compound HT-D1>

<F4-TCNQ>

The hole transport region may further include, in addition to the EBL, the HIL, and the HTL, a buffer layer. The buffer layer may help compensate for an optical resonance distance according to a wavelength of light emitted from the emission layer, and thus, a light-emission efficiency of a formed organic light-emitting device may be improved. For use as a material for forming the buffer layer, the materials for forming the hole transport region may be used. The EBL may prevent electron injection from the electron transport region.

The emission layer may be formed on the first electrode 110 or on the hole transport region by using various methods, such as vacuum deposition, spin coating, casting, an LB method, an ink-jet printing, a laser-printing, or an LITI method. When the emission layer is formed by vacuum deposition or spin coating, the deposition and coating conditions for forming the emission layer may be determined by referring to the deposition and coating conditions for forming the HIL.

When the organic light-emitting device 10 is a full color organic light-emitting device, the emission layer may be patterned into a red emission layer, a green emission layer, and a blue emission layer, according to a sub-pixel. In an implementation, the emission layer may have a stacked structure of a red emission layer, a green emission layer, and a blue emission layer, or may include a red light emission material, a green light emission material, and a blue light emission material, which are mixed with each other in a single layer, to emit white light.

The emission layer may include a host and a dopant.

The host (H) and the dopant (D) according to an embodiment may have an electron affinity EA and an ionization potential IP simultaneously satisfying the relationships of Equation (1) and Equation (2) below.

$$EA(D)-EA(H) \geq 0.2 \text{ eV} \qquad (1)$$

$$IP(H)-IP(D) \geq 0.2 \text{ eV} \qquad (2)$$

The host may include, in addition to a compound satisfying the relationships of Equations 1 and 2, above, at least one other material, e.g., TPBi, CBP, CDBP and TCP below.

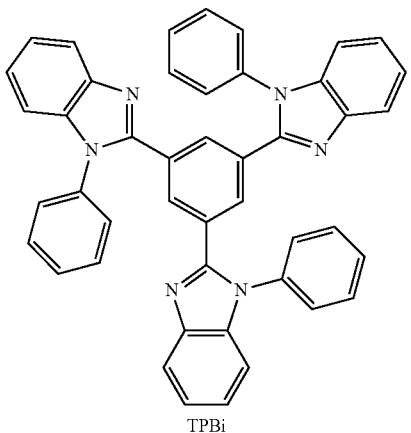

TPBi

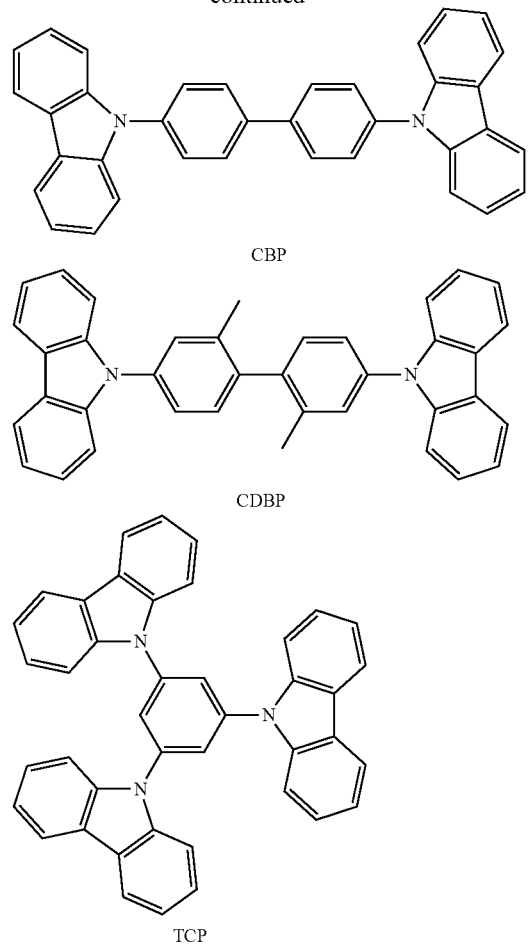

CBP

CDBP

TCP

In an implementation, the host may include a compound represented by Formula 301 below.

$$Ar_{301}\text{-}[(L_{301})_{xb1}\text{-}R_{301}]_{xb2} \qquad <\text{Formula 301}>$$

In Formula 301, $Ar_{301}$ may be selected from:

a naphthalene, a heptalene, a fluorene, a spiro-fluorene, a benzofluorene, a dibenzofluorene, a phenalene, a phenanthrene, a fluoranthene, and a triphenylene;

a naphthalene, a heptalene, a fluorene, a spiro-fluorene, a benzofluorene, a dibenzofluorene, a phenalene, a phenanthrene, a fluoranthene, and a triphenylene, each substituted with at least one of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, a monovalent non-aromatic condensed heteropolycyclic group, and —Si($Q_{301}$)($Q_{302}$)($Q_{303}$) (wherein $Q_{301}$ to $Q_{303}$ may be each independently selected from a hydrogen, a $C_1$-$C_{60}$ alkyl group, a $C_2$-$C_{60}$ alkenyl group, a $C_6$-$C_{60}$ aryl group, and a $C_2$-$C_{60}$ heteroaryl group);

$L_{301}$ may be understood by referring to the description provided in connection with L;

$R_{301}$ may be selected from:

a $C_1$-$C_{20}$ alkyl group and a $C_1$-$C_{20}$ alkoxy group;

a $C_1$-$C_{20}$ alkyl group and a $C_1$-$C_{20}$ alkoxy group, each substituted with at least one of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a phenyl group, a naphthyl group, a fluorenyl group, a spiro-fluorenyl group, a benzofluorenyl group, a phenanthrenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

a phenyl group, a naphthyl group, a fluorenyl group, a spiro-fluorenyl group, a benzofluorenyl group, a phenanthrenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazole group, and a triazinyl group; and a phenyl group, a naphthyl group, a fluorenyl group, a spiro-fluorenyl group, a benzofluorenyl group, a phenanthrenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

xb1 may be selected from 0, 1, 2, and 3; and xb2 may be selected from 1, 2, 3, and 4.

For example, in Formula 301, $L_{301}$ may be selected from:

a phenylene group, a naphthylene group, a fluorenylene group, a spiro-fluorenylene group, a benzofluorenylene group, a dibenzofluorenylene group, a phenanthrenylene group; and a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, and a chrysenylene group, each substituted with at least one of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, and a chrysenyl group, but they are not limited thereto.

The dopant may include, in addition to a compound satisfying the relationships above, at least one other material, e.g., a fluorescent dopant or a phosphorescent dopant.

In an implementation, the phosphorescent dopant may include an organometallic complex represented by Formula 401 below.

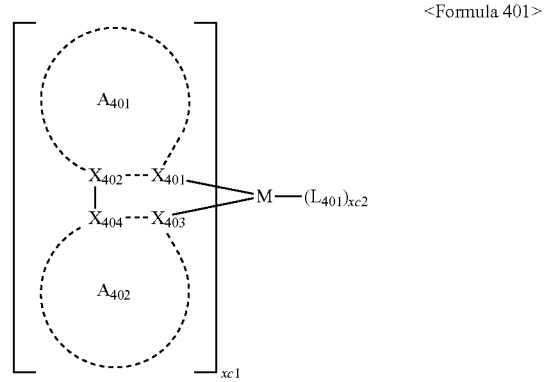

<Formula 401>

In Formula 401,

M may be selected from iridium (Ir), platinum (Pt), osmium (Os), titanium (Ti), zirconium (Zr), hafnium (Hf), europium (Eu), terbium (Tb), and thulium (Tm);

$X_{401}$ to $X_{404}$ may each independently be selected from nitrogen or carbon;

rings $A_{401}$ and $A_{402}$ may each independently be selected from a substituted or unsubstituted benzene, a substituted or unsubstituted naphthalene, a substituted or unsubstituted fluorene, a substituted or unsubstituted spiro-fluorene, a substituted or unsubstituted indene, a substituted or unsubstituted pyrrole, a substituted or unsubstituted thiophene, a substituted or unsubstituted furan, a substituted or unsubstituted imidazole, a substituted or unsubstituted pyrazole, a substituted or unsubstituted thiazole, a substituted or unsubstituted isothiazole, a substituted or unsubstituted oxazole, a substituted or unsubstituted isoxazole, a substituted or unsubstituted pyridine, a substituted or unsubstituted pyrazine, a substituted or unsubstituted pyrimidine, a substituted or unsubstituted pyridazine, a substituted or unsubstituted quinoline, a substituted or unsubstituted isoquinoline, a substituted or unsubstituted benzoquinoline, a substituted or unsubstituted quinoxalaine, a substituted or unsubstituted quinazoline, a substituted or unsubstituted carbazole, a substituted or unsubstituted benzoimidazole, a substituted or unsubstituted benzofuran, a substituted or unsubstituted benzothiophene, a substituted or unsubstituted isobenzothiophene, a substituted or unsubstituted benzoxazole, a substituted or unsubstituted isobenzoxazole, a substituted or unsubstituted triazole, a substituted or unsubstituted oxadiazole, a substituted or unsubstituted triazine, a substituted or unsubstituted dibenzofuran, and a substituted or unsubstituted dibenzothiophene;

at least one substituent of the substituted benzene, the substituted naphthalene, the substituted fluorene, the substituted spiro-fluorene, the substituted indene, the substituted pyrrole, the substituted thiophene, the substituted furan, the substituted imidazole, the substituted pyrazole, the substituted thiazole, the substituted isothiazole, the substituted oxazole, the substituted isoxazole, the substituted pyridine, the substituted pyrazine, the substituted pyrimidine, the substituted pyridazine, the substituted quinoline, the substituted isoquinoline, the substituted benzoquinoline, the substituted quinoxalaine, the substituted quinazoline, the substituted carbazole, the substituted benzoimidazole, the substituted benzofuran, the substituted benzothiophene, the substituted isobenzothiophene, the substituted benzoxazole, the substituted isobenzoxazole, the substituted triazole, the substituted oxadiazole, the substituted triazine, the substituted dibenzofuran, and the substituted dibenzothiophene may be selected from:

a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, a monovalent non-aromatic condensed heteropolycyclic group, —N($Q_{401}$)($Q_{402}$), —Si($Q_{403}$)($Q_{404}$)($Q_{405}$), and —B($Q_{406}$)($Q_{407}$);

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, and a non-aromatic condensed polycyclic group;

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, and a monovalent non-aromatic condensed heteropolycyclic group, each substituted with at least one of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, a monovalent non-aromatic condensed heteropolycyclic group, —N($Q_{411}$)($Q_{412}$), —Si($Q_{413}$)($Q_{414}$)($Q_{415}$), and —B($Q_{416}$)($Q_{417}$); and —N($Q_{421}$)($Q_{422}$), —Si($Q_{423}$)($Q_{424}$)($Q_{425}$), and —B($Q_{426}$)($Q_{427}$):

$L_{401}$ may be an organic ligand;
xc1 may be 1, 2, or 3; and
xc2 may be 0, 1, 2, or 3.

$L_{401}$ may be a monovalent, divalent, or trivalent organic ligand. For example, $L_{401}$ may be selected from a halogen ligand (for example, Cl or F), a diketone ligand (for example, acetylacetonate, 1,3-diphenyl-1,3-propandionate, 2,2,6,6-tetramethyl-3,5-heptandionate, or hexafluoroacetonate), a carboxylic acid ligand (for example, picolinate, dimethyl-3-pyrazolecarboxylate, or benzoate), a carbon mono-oxide ligand, an isonitrile ligand, a cyano ligand, and a phosphorous ligand (for example, phosphine and phosphaite).

In an implementation, when $A_{401}$ in Formula 401 has 2 or more substituents, the 2 or more substituents of $A_{401}$ may be bound to each other to form a saturated or unsaturated ring.

In an implementation, when $A_{402}$ in Formula 401 has 2 or more substituents, the 2 or more substituents of $A_{402}$ may be bound to each other to form a saturated or unsaturated ring.

In an implementation, when xc1 in Formula 401 is 2 or more, the 2 or more ligands

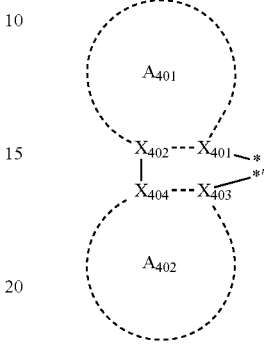

in Formula 401 may be identical to or different from each other. In an implementation, when xc1 in Formula 401 is 2 or more, $A_{401}$ and $A_{402}$ may be respectively directly connected to $A_{401}$ and $A_{402}$ of other neighboring ligands with or without a linking group (for example, a $C_1$-$C_5$ alkylene group or —N(R')— (wherein R' may be a $C_1$-$C_{10}$ alkyl group or a $C_6$-$C_{20}$ aryl group), or —C(=O)—).

In an implementation, the phosphorescent dopant may include, e.g., at least one of Compounds PD1 to PD74 below.

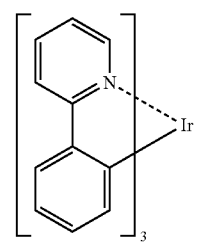

PD1

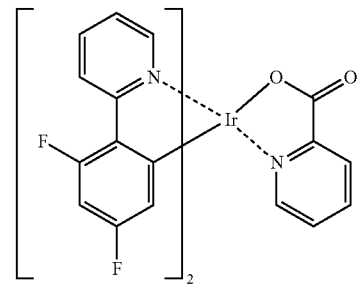

PD2

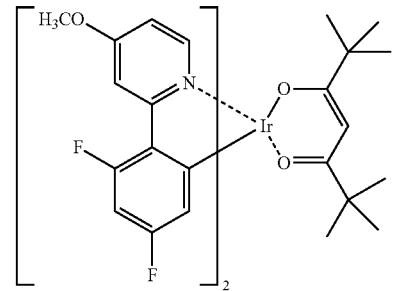

PD3

PD4
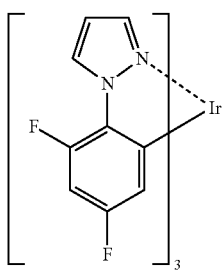
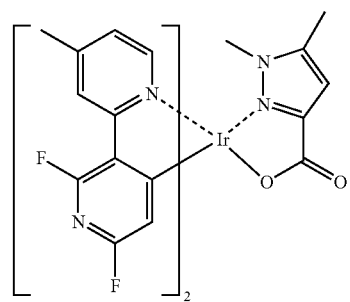
PD9
PD5
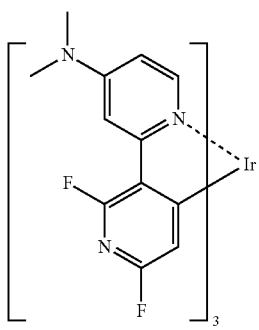
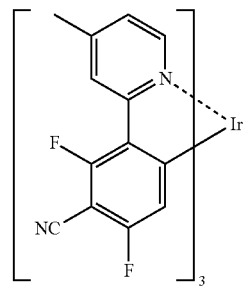
PD10
PD6
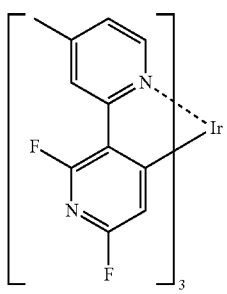
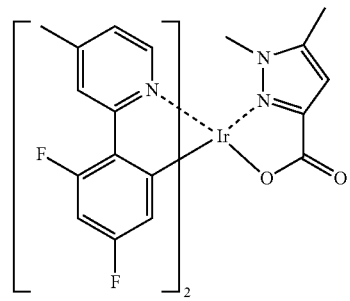
PD11
PD7
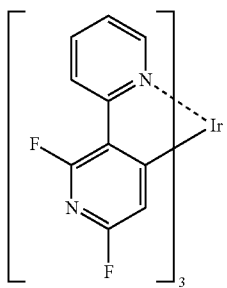
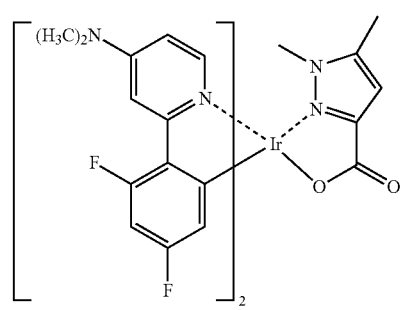
PD12
PD8
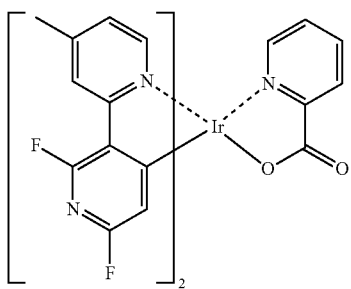
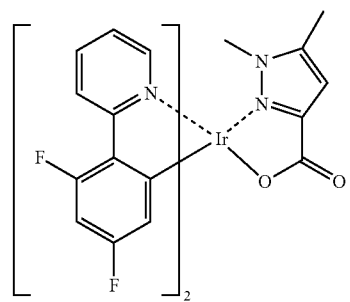
PD13

PD14
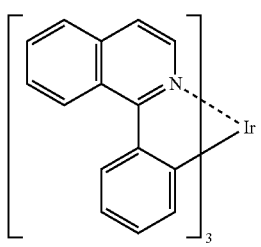
PD15
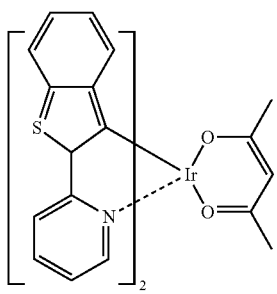
PD16
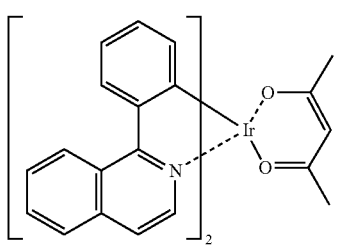
PD17
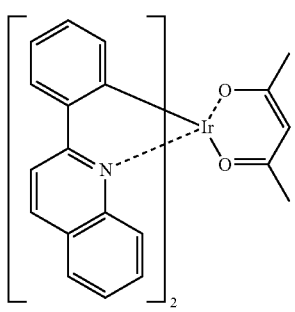
PD18
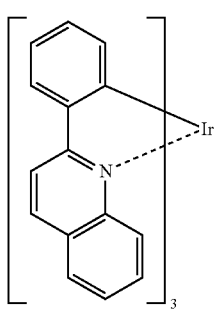
PD19
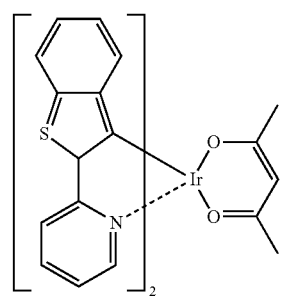
PD20
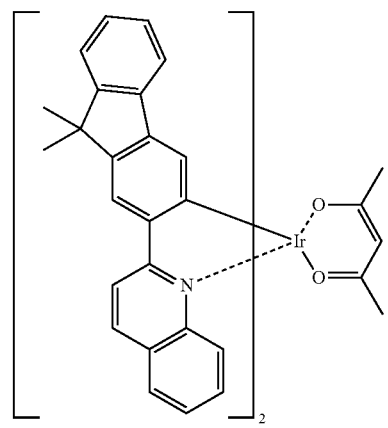
PD21
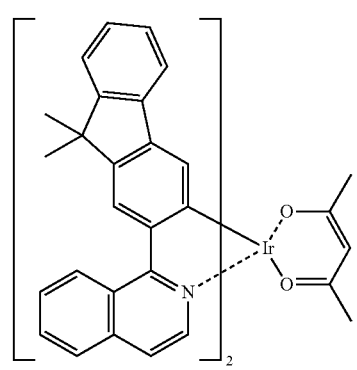
PD22
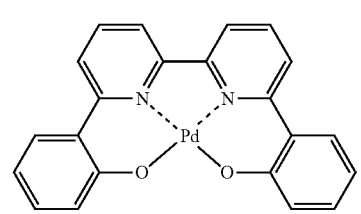
PD23
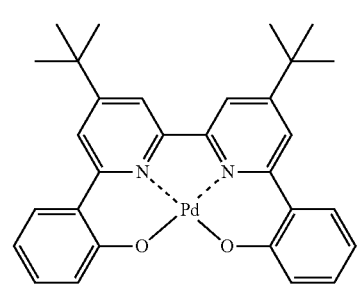

PD24 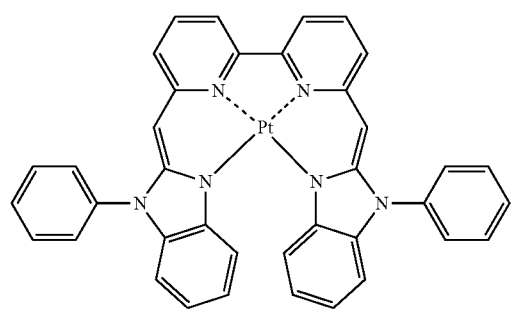
PD25 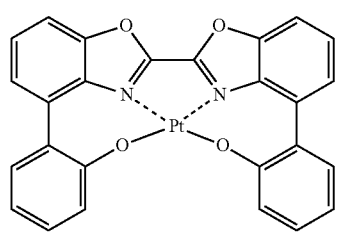
PD26 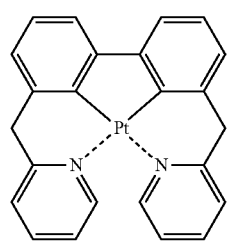
PD27 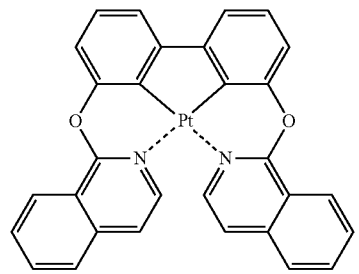
PD28 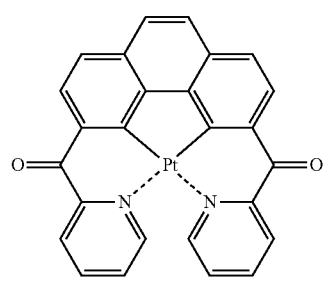
PD29 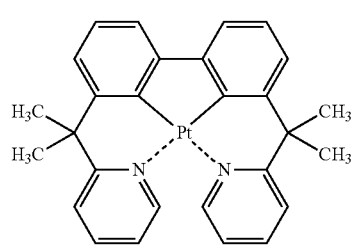
PD30 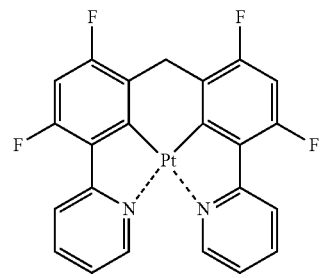
PD31 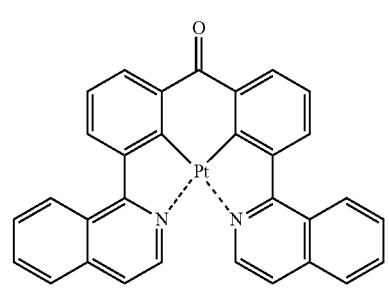
PD32 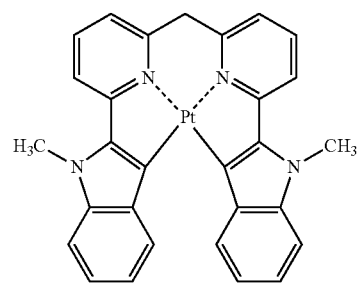
PD33 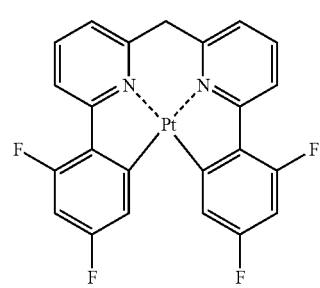
PD34 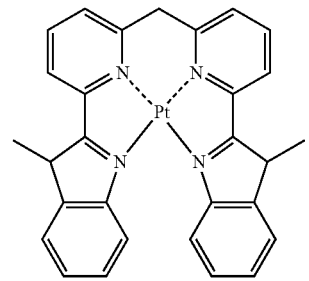

PD35 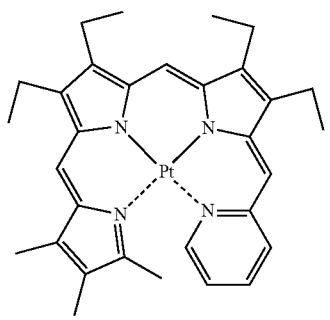
PD36 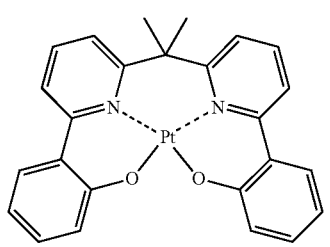
PD37 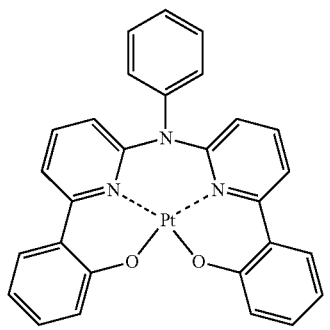
PD38 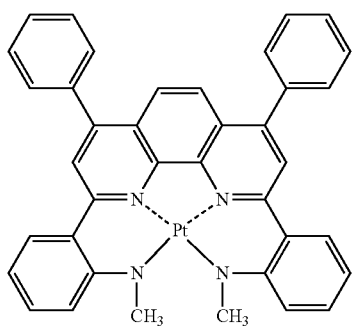
PD39 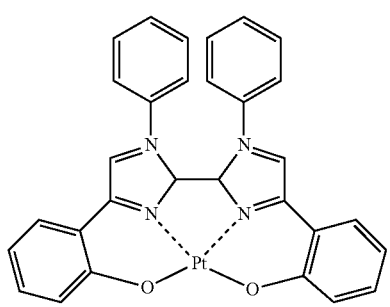
PD40 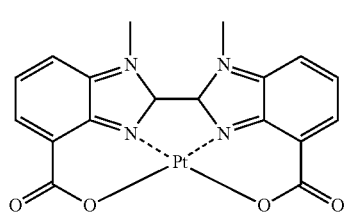
PD41 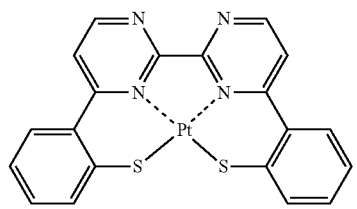
PD42 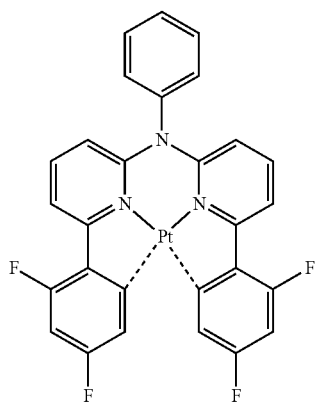
PD43 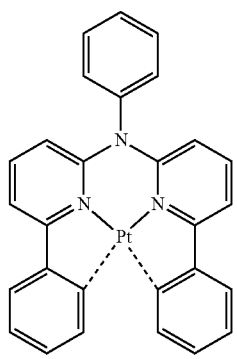
PD44 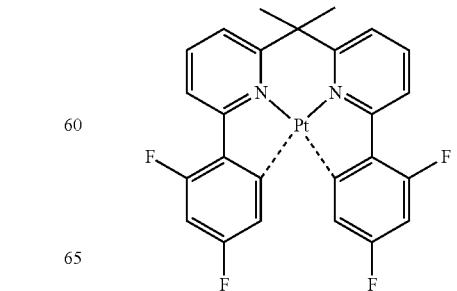

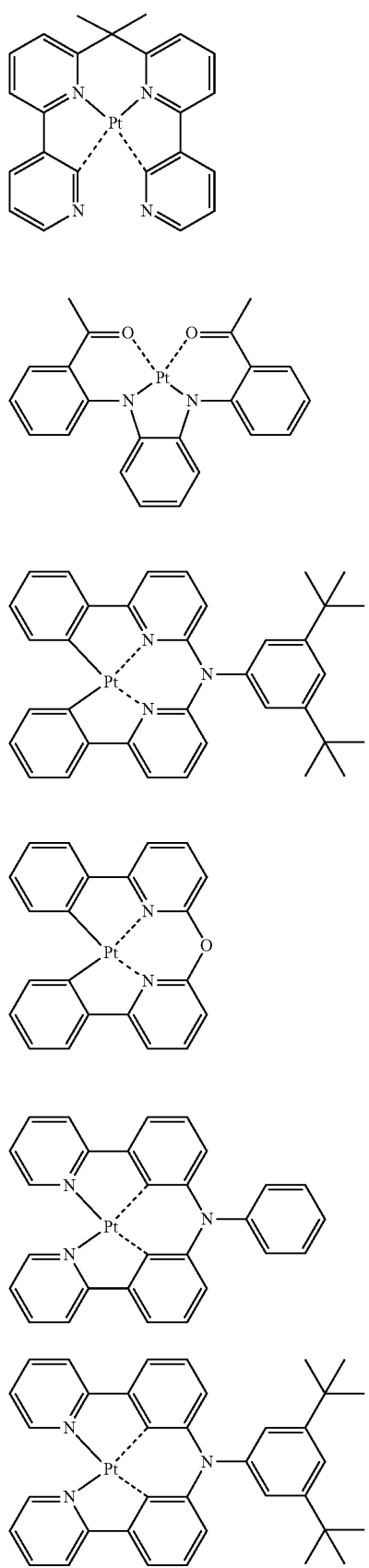
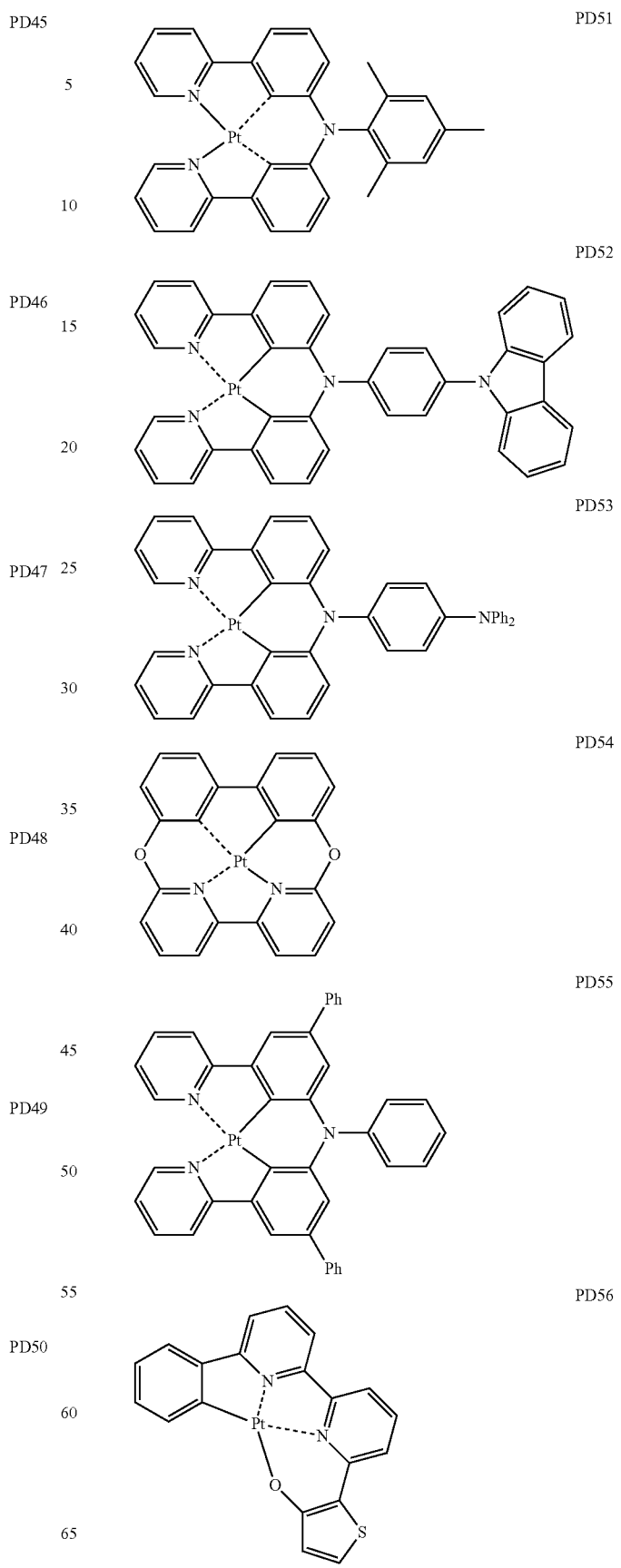

-continued
PD57 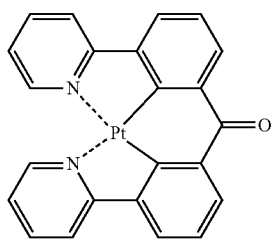
PD62 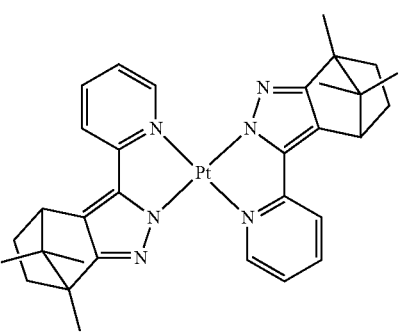
PD58 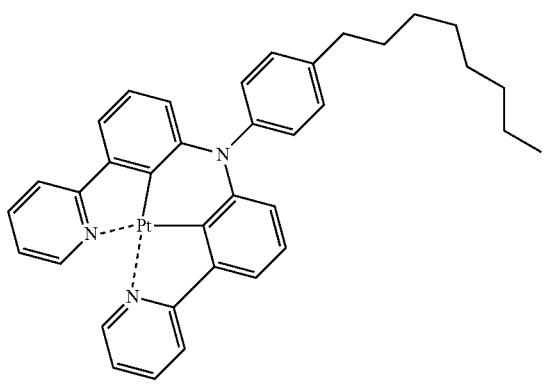
PD63 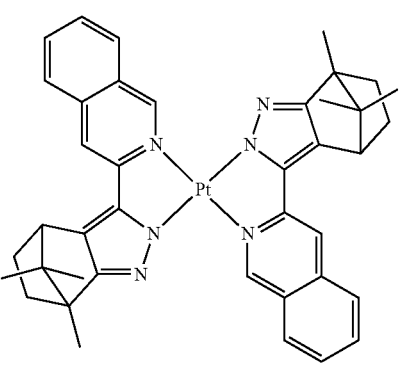
PD59 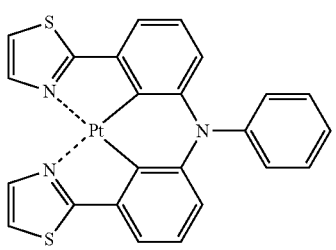
PD64 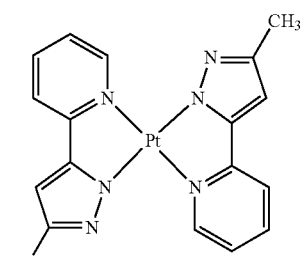
PD60 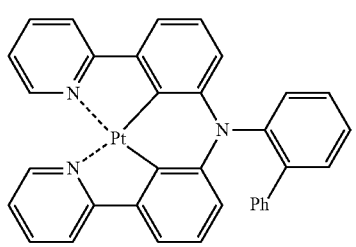
PD65 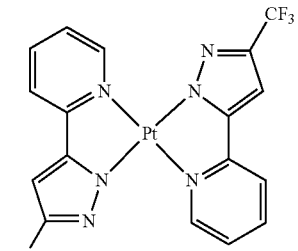
PD61 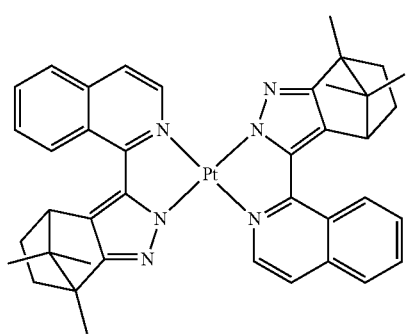
PD66 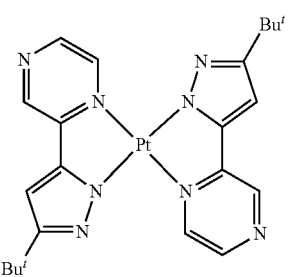

PD67 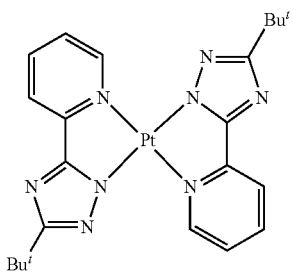

PD68 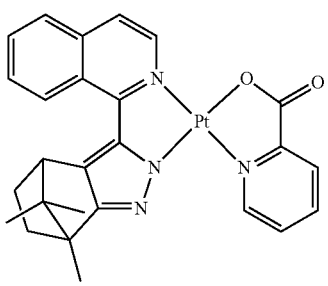

PD69 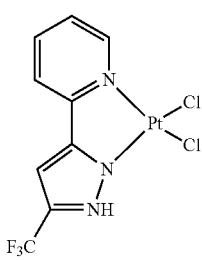

PD70 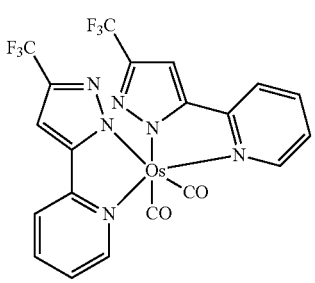

PD71 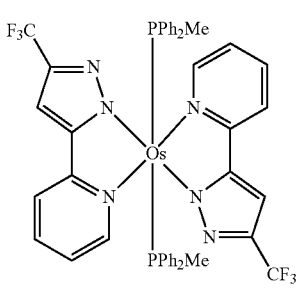

PD72 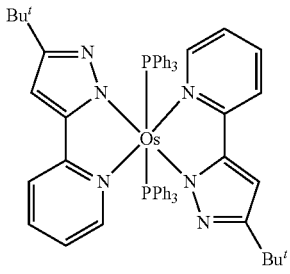

PD73 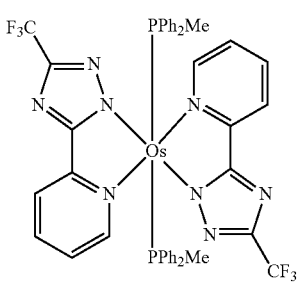

PD74 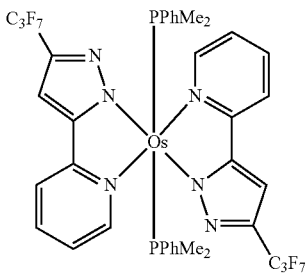

In an implementation, the phosphorescent dopant may include PtOEP below:

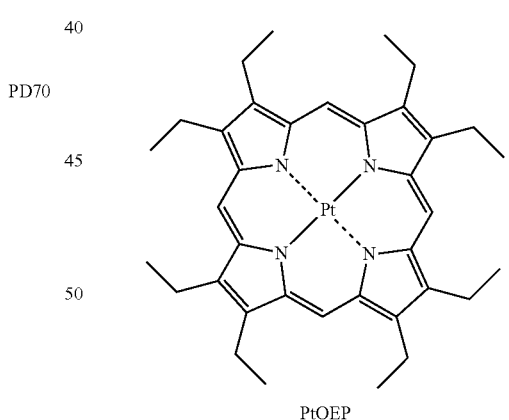

PtOEP

An amount of the dopant included in the emission layer may be, e.g., about 0.01 parts to about 30 parts by weight, based on 100 parts by weight of the host.

A thickness of the emission layer may be about 100 Å to about 1,000 Å, e.g., about 200 Å to about 600 Å. When the thickness of the emission layer is within this range, excellent light emission characteristics may be obtained without a substantial increase in driving voltage.

Then, the electron transport region may be disposed on the emission layer.

The electron transport region may include, e.g., at least one of an HBL, an ETL, and an EIL.

For example, the electron transport region may have a structure of ETL/EIL or a structure of HBL/ETL/EIL, wherein layers of each structure are sequentially stacked on the emission layer in the stated order.

In an implementation, the organic layer 150 may include the electron transport region between the emission layer and the second electrode 190. The electron transport region may include a layer including a material that has a triplet energy $T_1$ that is greater than that of a phosphorescent dopant, and the layer may be adjacent to the emission layer. In an implementation, the layer may be, e.g., an ETL.

In an implementation, the electron transport region may include an HBL. When the emission layer uses a phosphorescent dopant, the HBL may be formed to help prevent diffusion of triplet excitons or holes into the ETL.

When the electron transport region includes the HBL, the HBL may be formed on the emission layer by using various methods, such as vacuum deposition, spin coating casting, an LB method, an ink-jet printing, a laser-printing, or an LITI method. When the HBL is formed by vacuum deposition or spin coating, deposition and coating conditions for forming the HBL may be determined by referring to the deposition and coating conditions for forming the HIL.

The HBL may include, e.g., at least one of BCP and Bphen below.

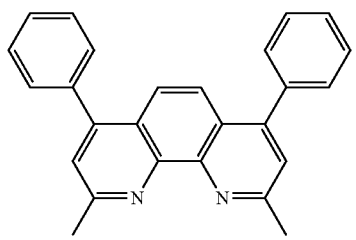

BCP

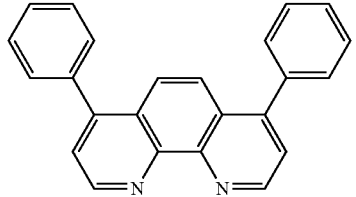

Bphen

A thickness of the HBL may be about 20 Å to about 1,000 Å, e.g., about 30 Å to about 300 Å. When the thickness of the HBL is within these ranges, excellent hole blocking characteristics may be obtained without a substantial increase in driving voltage.

The electron transport region may include an ETL, and the ETL may be formed on the emission layer or on the HBL by using various methods, such as vacuum deposition, spin coating casting, an LB method, an ink-jet printing, a laser-printing, or an LITI method. When the ETL is formed by vacuum deposition or spin coating, the deposition and coating conditions for the ETL may be determined by referring to the deposition and coating conditions for forming the HIL.

In an implementation, the organic layer 150 may include the electron transport region between the emission layer and the second electrode 190, and the electron transport region may include an ETL. Here, the ETL may include a plurality of layers. For example, the electron transport region may include a first ETL and a second ETL.

The ETL may further include, e.g., at least one of BCP, Bphen, and $Alq_3$, Balq, TAZ, and NTAZ below.

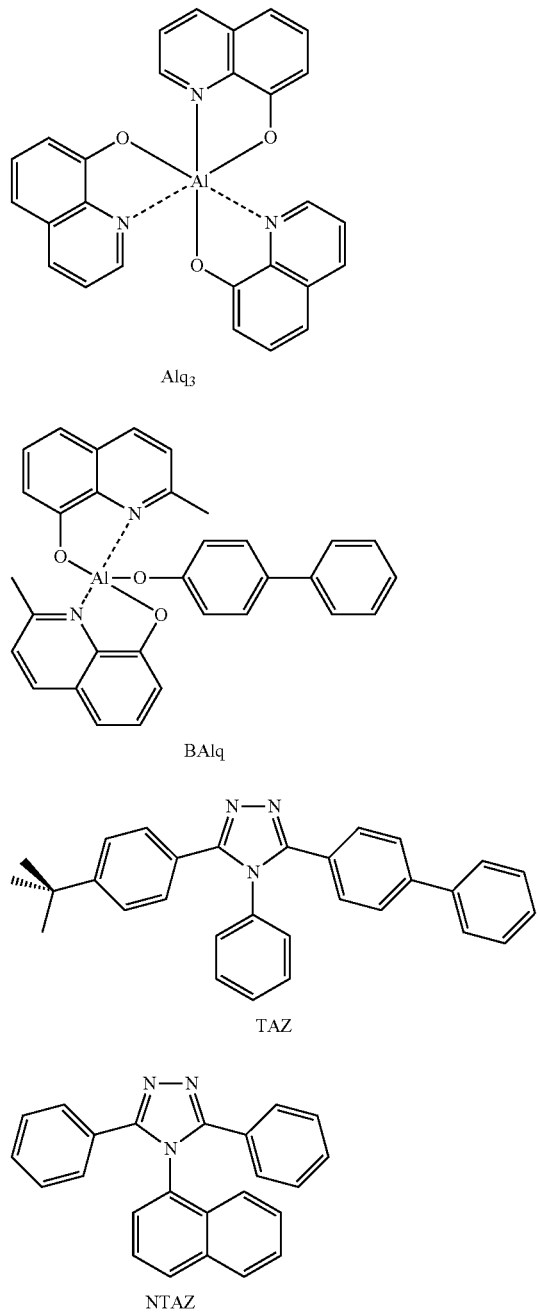

A thickness of the ETL may be about 100 Å to about 1,000 Å, e.g., about 150 Å to about 500 Å. When the thickness of ETL is within these ranges, satisfactory electron transporting characteristics may be obtained without a substantial increase in driving voltage.

The ETL may further include, in addition to the materials described above, a metal-containing material.

The metal-containing material may include a lithium (Li) complex. The Li complex may include, e.g., Compound ET-D1 (lithium quinolate, LiQ) or ET-D2 below.

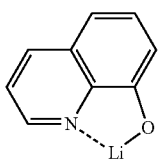

ET-D1

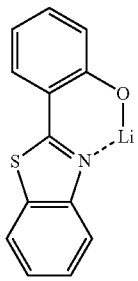

ET-D2

The electron transport region may include an EIL that facilitates the electron injection from the second electrode 190.

The EIL may be formed on the ETL by using various methods, such as vacuum deposition, spin coating casting, an LB method, an ink-jet printing, a laser-printing, or an LITI method. When the EIL is formed by vacuum deposition or spin coating, the deposition and coating conditions for the EIL may be determined by referring to the deposition and coating conditions for the HIL.

The EIL may include at least one selected from LiF, NaCl, CsF, $Li_2O$, BaO, and LiQ.

A thickness of the EIL may be about 1 Å to about 100 Å, e.g., about 3 Å to about 90 Å. When the thickness of the EIL is within these ranges, satisfactory electron transporting characteristics may be obtained without a substantial increase in driving voltage.

The second electrode 190 may be disposed on the organic layer 150. The second electrode 190 may be a cathode that is an electron injection electrode. In this regard, a material for forming the second electrode 190 may be a material having a low work function, and examples thereof may include a metal, an alloy, an electrically conductive compound, or a mixture thereof. Examples of the material for forming the second electrode 190 may include lithium (Li), magnesium (Mg), aluminum (Al), aluminum-lithium (Al—Li), calcium (Ca), magnesium-indium (Mg—In), and magnesium-silver (Mg—Ag). In an implementation, the material for forming the second electrode 190 may include ITO or IZO. The second electrode 190 may be a reflective electrode, a semi-transmissive electrode, or a transmissive electrode.

Meanwhile, the organic layer 150 of the organic light-emitting device 10 according to an embodiment may be formed by vacuum deposition using a compound according to an embodiment, or by a wet method including coating a compound prepared as solution according to an embodiment.

An organic light-emitting device according to an embodiment may be loaded onto various types of flat display devices, e.g., a passive matrix organic light-emitting display device and an active matrix organic light-emitting display device. When the organic light-emitting device is loaded onto an active matrix organic light-emitting display device, a first electrode provided on the substrate may be electrically connected to a source electrode or a drain electrode of a thin film transistor as a pixel electrode. In an implementation, the organic light-emitting device may be provided in a flat display device that may display images on both sides.

Hereinafter, descriptions of representative substituents of the substituents as used herein are as follows (carbon numbers defined for the substituents are non-limited and do not limit properties of the substituents, and substituents that are not defined herein may be defined according to their general description).

As used herein, the $C_1$-$C_{60}$ alkyl group refers to a linear or branched aliphatic $C_1$-$C_{60}$ hydrocarbon monovalent group, and detailed examples thereof include a methyl group, an ethyl group, a propyl group, an isobutyl group, a sec-butyl group, a ter-butyl group, a pentyl group, an iso-amyl, and a hexyl group. As used herein, the $C_1$-$C_{60}$ alkylene group refers to a divalent group having the same structure as the $C_1$-$C_{60}$ alkyl group.

As used herein, the $C_1$-$C_{60}$ alkoxy group refers to a monovalent group having a formula of —$OA_{101}$ (wherein $A_{101}$ is the $C_1$-$C_{60}$ alkyl group), and detailed examples thereof include a methoxy group, an ethoxy group, and an isopropyloxy group.

As used herein, the $C_2$-$C_{60}$ alkenyl group refers to a hydrocarbon group formed by substituting at least one carbon double bond in the middle or terminal of the $C_2$-$C_{60}$ alkyl group, and detailed examples thereof include an ethenyl group, a prophenyl group, and a butenyl group. As used herein, the $C_2$-$C_{60}$ alkenylene group refers to a divalent group having the same structure as the $C_2$-$C_{60}$ alkenyl group.

As used herein, the $C_2$-$C_{60}$ alkynyl group refers to a hydrocarbon group formed by substituting at least one carbon triple bond in the middle or terminal of the $C_2$-$C_{60}$ alkyl group, and detailed examples thereof include an ethynyl group and a propynyl group. As used herein, the $C_2$-$C_{60}$ alkynylene group refers to a divalent group having the same structure as the $C_2$-$C_{60}$ alkynyl group.

As used herein, the $C_3$-$C_{10}$ cycloalkyl group refers to a saturated $C_3$-$C_{10}$ monovalent hydrocarbon monocyclic group, and detailed examples thereof include a cyclopropyl group, a cyclobutyl group, a cyclopentyl group, a cyclohexyl group, and a cycloheptyl group. As used herein, the $C_3$-$C_{10}$ cycloalkylene group refers to a divalent group having the same structure as the $C_3$-$C_{10}$ cycloalkyl group.

As used herein, the $C_2$-$C_{10}$ heterocycloalkyl group refers to a $C_2$-$C_{10}$ monovalent monocyclic group including at least one heteroatom selected from N, O, P, and S as a ring-forming atom, and detailed examples thereof include a tetrahydrofuranyl group and a tetrahydrothiophenyl group. As used herein, the $C_2$-$C_{10}$ heterocycloalkylene group refers to a divalent group having the same structure as the $C_2$-$C_{10}$ heterocycloalkyl group.

As used herein, the $C_3$-$C_{10}$ cycloalkenyl group refers to a $C_3$-$C_{10}$ monovalent monocyclic group that has at least one double bond in a ring, but does not have aromacity, and detailed examples thereof include a cyclopentenyl group, a cyclohexenyl group, and a cycloheptenyl group. As used herein, the $C_3$-$C_{10}$ cycloalkenylene group refers to a divalent group having the same structure as the $C_3$-$C_{10}$ cycloalkenyl group.

As used herein, the $C_2$-$C_{10}$ heterocycloalkenyl group refers to a $C_2$-$C_{10}$ monovalent monocyclic group including at least one heteroatom selected from N, O, P, and S as a ring-forming atom, and includes at least one double bond in a ring. Detailed examples of the $C_2$-$C_{10}$ heterocycloalkenyl group include a 2,3-hydrofuranyl group and a 2,3-hydrothiophenyl group. As used herein, the $C_2$-$C_{10}$ heterocycloalkenylene group refers to a divalent group having the same structure as the $C_2$-$C_{10}$ heterocycloalkenyl group.

As used herein, the $C_6$-$C_{60}$ aryl group refers to $C_6$-$C_{60}$ monovalent group having a carbocyclic aromatic system, and the $C_6$-$C_{60}$ arylene group refers to a divalent group having a $C_6$-$C_{60}$ carbocyclic aromatic system. Detailed examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group include 2 or more rings, the 2 or more rings may be fused to each other.

As used herein, the $C_2$-$C_{60}$ heteroaryl group refers to a monovalent group having a $C_2$-$C_{60}$ carbocyclic aromatic system including at least one heteroatom selected from N, O, P, and S as a ring-forming atom, and the $C_2$-$C_{60}$ heteroarylene group refers to a divalent group having a $C_2$-$C_{60}$ carbocyclic aromatic system including at least one heteroatom selected from N, O, P, and S. Detailed examples of the $C_2$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_2$-$C_{60}$ heteroaryl group and the $C_2$-$C_{60}$ heteroarylene group include 2 or more rings, the 2 or more rings may be fused to each other.

As used herein, the $C_6$-$C_{60}$ aryloxy group indicates to —$OA_{102}$ (wherein, $A_{102}$ is the $C_6$-$C_{60}$ aryl group), and the $C_6$-$C_{60}$ arylthio group indicates —$SA_{103}$ (wherein, $A_{103}$ is the $C_6$-$C_{60}$ aryl group).

As used herein, the monovalent non-aromatic condensed polycyclic group refers to a monovalent group having 2 or more rings that are fused to each other, including only carbon as a ring forming atom (for example, carbon number may be 8 to 60), wherein the entire molecule does not have aromaticity. Detailed examples of the monovalent non-aromatic condensed polycyclic group include a fluorenyl group or the like. As used herein, the divalent non-aromatic condensed polycyclic group refers to a divalent group having the same structure as the monovalent non-aromatic condensed polycyclic group.

As used herein, the monovalent non-aromatic condensed heteropolycyclic group refers to a monovalent group having 2 or more rings that are fused to each other, including a heteroatom selected from N, O, P, and S as a ring-forming atom, in addition to carbon (for example, carbon number may be 2 to 60), wherein the entire molecule does not have aromaticity. The monovalent non-aromatic condensed heteropolycyclic group includes a carbazolyl group or the like. As used herein, the divalent non-aromatic condensed heteropolycyclic group refers to a divalent group having the same structure as the monovalent non-aromatic heterocondensed polycyclic group.

As used herein, at least one substituent of the substituted $C_3$-$C_{10}$ cycloalkylene group, the substituted $C_2$-$C_{10}$ heterocycloalkylene group, the substituted $C_3$-$C_{10}$ cycloalkenylene group, the substituted $C_2$-$C_{10}$ heterocycloalkenylene group, the substituted $C_6$-$C_{60}$ arylene group, the substituted $C_2$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_2$-$C_{10}$ heterocycloalkyl group, the substituted $C_3$-$C_{10}$ cycloalkenyl group, the substituted $C_2$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_2$-$C_{60}$ heteroaryl group, the substituted monovalent non-aromatic condensed polycyclic group, and the substituted monovalent non-aromatic condensed heteropolycyclic group may be selected from:

a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group and $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, and —$B(Q_{16})(Q_{17})$;

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, and a monovalent non-aromatic condensed heteropolycyclic group, each substituted with at least one of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, and —$B(Q_{26})(Q_{27})$; and —$N(Q_{31})(Q_{32})$, —$Si(Q_{33})(Q_{34})(Q_{35})$, and —$B(Q_{36})(Q_{37})$, wherein $Q_1$ to $Q_7$, $Q_{11}$ to $Q_{17}$, $Q_{21}$ to $Q_{27}$, and $Q_{31}$ to $Q_{37}$ may be each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_2$-$C_{60}$ heteroaryl group, a monovalent non-aromatic condensed polycyclic group, and a monovalent non-aromatic condensed heteropolycyclic group.

For example, at least one substituent of the substituted $C_3$-$C_{10}$ cycloalkylene group, the substituted $C_2$-$C_{10}$ heterocycloalkylene group, the substituted $C_3$-$C_{10}$ cycloalkenylene group, the substituted $C_2$-$C_{10}$ heterocycloalkenylene group, the substituted $C_6$-$C_{60}$ arylene group, the substituted $C_2$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_2$-$C_{10}$ heterocycloalkyl group, the substituted $C_3$-$C_{10}$ cycloalkenyl group, the substituted $C_2$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_2$-$C_{60}$ heteroaryl group, the substituted monovalent non-aromatic condensed polycyclic group, and the substituted monovalent non-aromatic condensed heteropolycyclic group may be selected from:

a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, and $C_1$-$C_{60}$ alkoxy group;

a $C_1$-$C_{60}$ alkyl group, a $C_2$-$C_{60}$ alkenyl group, a $C_2$-$C_{60}$ alkynyl group, and $C_1$-$C_{60}$ alkoxy group, each substituted with at least one of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a cyclopentyl group, a cyclohexyl group, a cycloheptyl group, a cyclopentenyl group, a cyclohexenyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzooxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, an imidazopyridinyl group, an imidazopyrimidinyl group, —N($Q_{11}$)($Q_{12}$), —Si($Q_{13}$)($Q_{14}$)($Q_{15}$), and —B($Q_{16}$)($Q_{17}$);

a cyclopentyl group, a cyclohexyl group, a cycloheptyl group, a cyclopentenyl group, a cyclohexenyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzooxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, an imidazopyridinyl group, and an imidazopyrimidinyl group;

a cyclopentyl group, a cyclohexyl group, a cycloheptyl group, a cyclopentenyl group, a cyclohexenyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzooxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, an imidazopyridinyl group, and an imidazopyrimidinyl group, each substituted with at least one of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a cyclopentyl group, a cyclohexyl group, a cycloheptyl group, a cyclopentenyl group, a cyclohexenyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzooxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, an imidazopyridinyl group, an imidazopyrimidinyl group, $-N(Q_{21})(Q_{22})$, $-Si(Q_{23})(Q_{24})(Q_{25})$, and $-B(Q_{26})(Q_{27})$, and
$-N(Q_{31})(Q_{32})$, $-Si(Q_{33})(Q_{34})(Q_{35})$, and $-B(Q_{36})(Q_{37})$, wherein $Q_1$ to $Q_7$, $Q_{11}$ to $Q_{17}$, $Q_{21}$ to $Q_{27}$, and $Q_{31}$ to $Q_{37}$ may be each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a cyclopentyl group, a cyclohexyl group, a cycloheptyl group, a cyclopentenyl group, a cyclohexenyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzooxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, an imidazopyridinyl group, and an imidazopyrimidinyl group.

The term "Ph" used herein refers to a phenyl group, the term "Me" used herein refers to a methyl group, the term "Et" used herein refers to an ethyl group, and the term "ter-Bu" or "Bu$^t$" used herein refers to a tert-butyl group.

Hereinafter, the organic light-emitting devices according to embodiments of the present invention will now be described in greater detail with reference to the following examples.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Example 1

An ITO glass substrate was cut into a size of 50 mm×50 mm×0.5 mm, ultrasonically washed with acetone, isopropyl alcohol, and pure water each for 15 minutes, and cleaned by exposure to ultraviolet rays for 30 minutes and then to ozone.

Then, Compound HT1 was vacuum deposited on the ITO glass substrate to form an HTL having a thickness of 600 Å, and Compound PH1 (as a host) and 5 wt % FIrpic (as a dopant) were vacuum co-deposited on the HTL to form an emission layer having a thickness of 300 Å. Thereafter, Compound ET1 and Liq were co-deposited at a weight ratio of 5:5 on the emission layer to form an ETL having a thickness of 400 Å. Liq and Al were sequentially vacuum deposited thereon as an EIL into a thickness of 10 Å and as a cathode into a thickness of 2,000 Å, respectively, to thereby manufacture an organic light-emitting device.

Example 2

An organic light-emitting device was manufactured in the same manner as in Example 1, except that Compound PH2 was used instead of Compound PH1 as a host material. In particular, an organic light-emitting device including a structure of ITO/HT1 (600 Å)/PH2+5% FIrpic (300 Å)/ET1+Liq (400 Å)/Liq (10 Å)/Al (2,000 Å) was manufactured.

Example 3

An ITO glass substrate was cut into a size of 50 mm×50 mm, ultrasonically washed with acetone, isopropyl alcohol, and pure water each for 15 minutes, and cleaned by exposure to ultraviolet rays for 30 minutes and then to ozone. Then, Compound HT2 was vacuum deposited on the ITO glass substrate to form an HTL having a thickness of 600 Å, and Compound PH3 (as a host) and 5 wt % FCNIr (as a dopant) were vacuum co-deposited on the HTL to form an emission layer having a thickness of 300 Å. Thereafter, Compound ET2 was vacuum deposited on the emission layer having a thickness of 50 Å to form a first electron transport layer, and Alq$_3$ was vacuum deposited on the first electron transport layer to form a second ETL having a thickness of 350 Å. Liq and Al were sequentially vacuum deposited thereon as an EIL into a thickness of 10 Å and a cathode into a thickness of 2,000 Å, respectively, to thereby manufacture an organic light-emitting device.

Example 4

An organic light-emitting device was manufactured in the same manner as in Example 3, except that Compound PH4 was used instead of Compound PH3 as a host material. That is, an organic light-emitting device including a structure of ITO/HT2 (600 Å)/PH4+5% FCNIr (300 Å)/ET2 (50 Å)/Alq$_3$ (350 Å)/Liq (10 Å)/Al (2,000 Å) was manufactured.

Example 5

An organic light-emitting device was manufactured in the same manner as in Example 3, except that Compound PH5 was used instead of Compound PH3 as a host material. That is, an organic light-emitting device including a structure of ITO/HT2 (600 Å)/PH5+5% FCNIr (300 Å)/ET2 (50 Å)/Alq$_3$ (350 Å)/Liq (10 Å)/Al (2,000 Å) was manufactured.

Example 6

An organic light-emitting device was manufactured in the same manner as in Example 3, except that Compound PH6 was used instead of Compound PH3 as a host material and that FCNIrpic was used instead of FCNIr as a dopant material. That is, an organic light-emitting device including a structure of ITO/HT2 (600 Å)/PH6+5% FCNIrpic (300 Å)/ET2 (50 Å)/Alq$_3$ (350 Å)/Liq (10 Å)/Al (2,000 Å) was manufactured.

Example 7

An organic light-emitting device was manufactured in the same manner as in Example 6, except that Compound PH7 was used instead of PH6 as a host material. That is, an organic light-emitting device including a structure of ITO/HT2 (600 Å)/PH7+5% FCNIrpic (300 Å)/ET2 (50 Å)/Alq$_3$ (350 Å)/Liq (10 Å)/Al (2,000 Å) was manufactured.

Comparative Example 1: In the Case of not Satisfying the Relationship of Equation 3

An organic light-emitting device was manufactured in the same manner as in Example 1, except that Compound PH8 was used instead of Compound PH1 as a host material. That is, an organic light-emitting device including a structure of ITO/HT1 (600 Å)/PH8+5% FIrpic (300 Å)/ET1+Liq (400 Å)/Liq (10 Å)/Al (2,000 Å) was manufactured.

Comparative Example 2: In the Case of not Satisfying the Relationship of Equation 3

An organic light-emitting device was manufactured in the same manner as in Example 3, except that Compound PH2 was used instead of Compound PH3 as a host material. That is, an organic light-emitting device including a structure of ITO/HT2 (600 Å)/PH2+5% FCNIr (300 Å)/ET2 (50 Å)/Alq$_3$ (350 Å)/Liq (10 Å)/Al (2,000 Å) was manufactured.

Comparative Example 3: In the Case of not Satisfying the Relationship of Equation 1

An organic light-emitting device was manufactured in the same manner as in Example 1, except that Compound PH7 was used instead of Compound PH1 as a host material. That is, an organic light-emitting device including a structure of ITO/HT1 (600 Å)/PH7+5% FIrpic (300 Å)/ET1+Liq (400 Å)/Liq (10 Å)/Al (2,000 Å) was manufactured.

Comparative Example 4: In the Case of not Satisfying the Relationship of Equation 1

An organic light-emitting device was manufactured in the same manner as in Example 3, except that Compound PH9 was used instead of Compound PH3. That is, an organic light-emitting device having a structure of ITO/HT2 (600 Å)/PH9+5% FCNIr (300 Å)/ET2 (50 Å)/Alq$_3$ (350 Å)/Liq (10 Å)/Al (2,000 Å) was manufactured.

Comparative Example 5: In the Case of not Satisfying the Relationship of $T_1$ (H)≤$T_1$ (D)

An organic light-emitting device was manufactured in the same manner as in Example 1, except that Compound PH10 was used instead of Compound PH1 as a host material. That is, an organic light-emitting device having a structure of ITO/HT1 (600 Å)/PH10+5% FIrpic (300 Å)/ET1+Liq (400 Å)/Liq (10 Å)/Al (2,000 Å) was manufactured.

Comparative Example 6: In the Case of not Satisfying the Relationship of $T_1$ (H)≤$T_1$ (D)

An organic light-emitting device was manufactured in the same manner as in Example 6, except that Compound PH10 was used instead of PH6 as a host material. That is, an organic light-emitting device having a structure of ITO/HT2 (600 Å)/PH10+5% FCNIrpic (300 Å)/ET2 (50 Å)/Alq$_3$ (350 Å)/Liq (10 Å)/Al (2,000 Å) was manufactured.

Comparative Example 7: In the Case of Including a Material Having a Low $T_1$ in the HTL An organic light-emitting device was manufactured in the same manner as in Example 1, except that NPB was used instead of HT1 as a material for forming the HTL. That is, an organic light-emitting device having a structure of ITO/NPB (600 Å)/PH1+5% FIrpic (300 Å)/ET1+Liq (400 Å)/Liq (10 Å)/Al (2,000 Å) was manufactured.

Comparative Example 8: In the Case of Including a Material Having a Low $T_1$ in the ETL An organic light-emitting device was manufactured in the same manner as in Example 1, except that Alq$_3$ was used instead of ET1 and Liq as a material for forming the ETL. That is, an organic light-emitting device having a structure of ITO/HT1 (600 Å)/PH1+5% FIrpic (300 Å)/Alq$_3$ (400 Å)/Liq (10 Å)/Al (2,000 Å) was manufactured.

Comparative Example 9: In the Case of Including a Material Having a Low $T_1$ in Both the HTL and the ETL An organic light-emitting device was manufactured in the same manner as in Example 1, except that Alq$_3$ was used instead of ET1 and Liq as a material for forming the ETL and that NPB was used instead of HT1 as a material for forming the HTL. That is, an organic light-emitting device having a structure of ITO/NPB (600 Å)/PH1+5% FIrpic (300 Å)/Alq$_3$ (400 Å)/Liq (10 Å)/Al (2,000 Å) was manufactured.

PH1
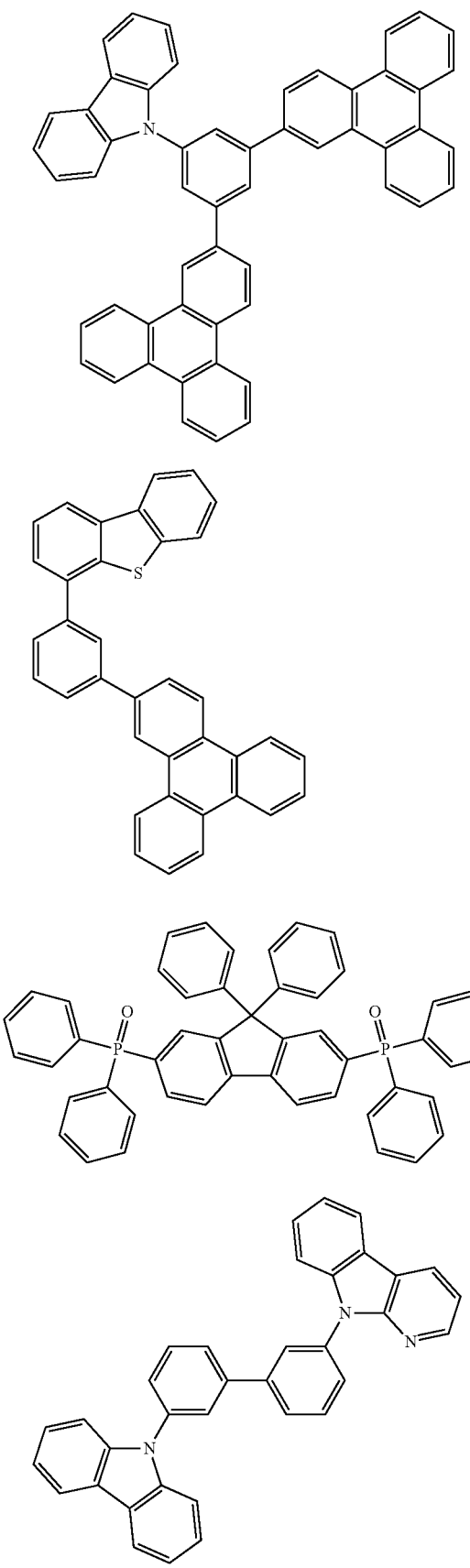
PH2
PH3
PH4
PH5
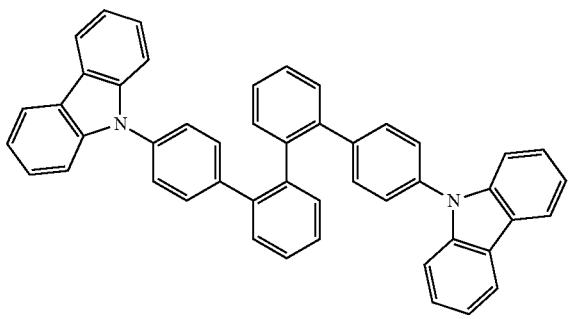
PH6
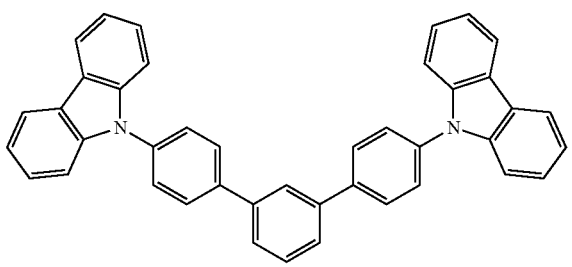
PH7
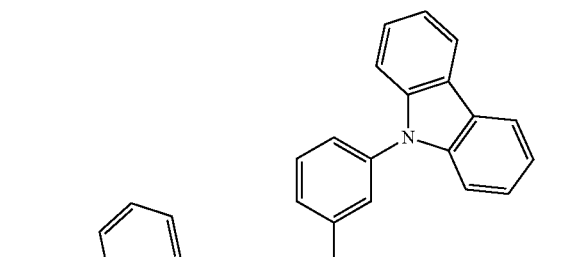
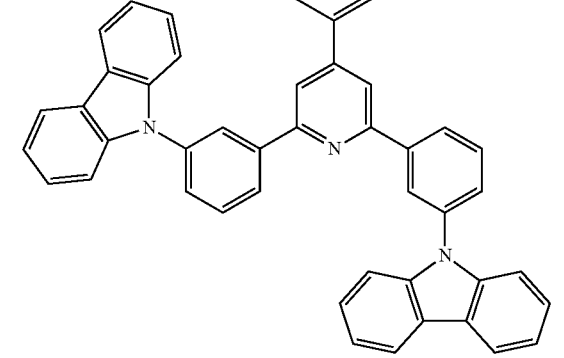
PH8
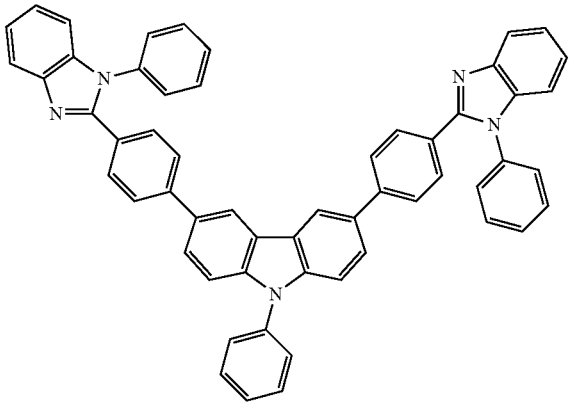

PH9
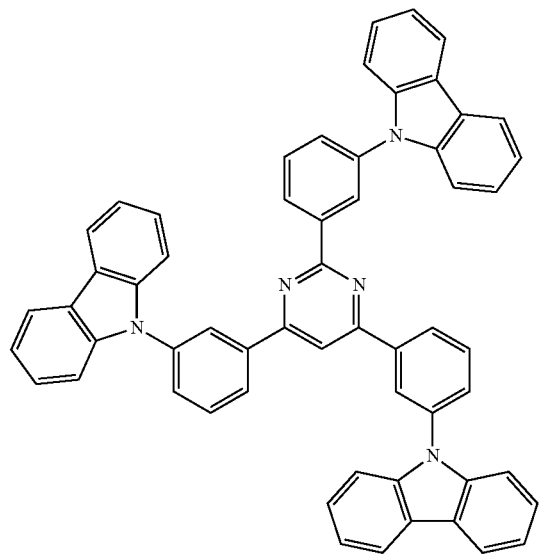
PH10
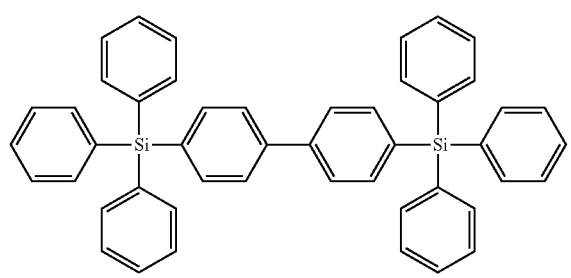
Flrpic
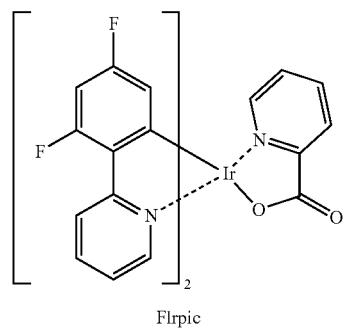
FCNIr
FCNIrpic
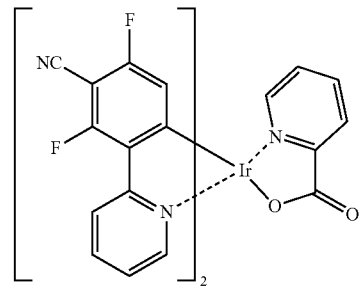
HT1
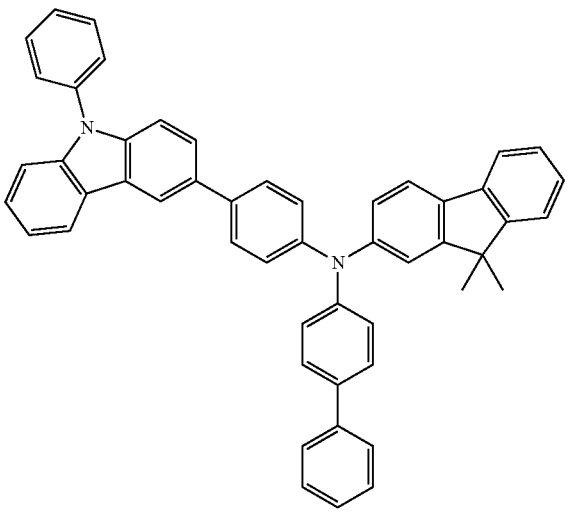
HT2
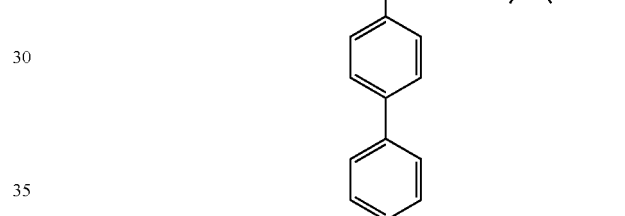
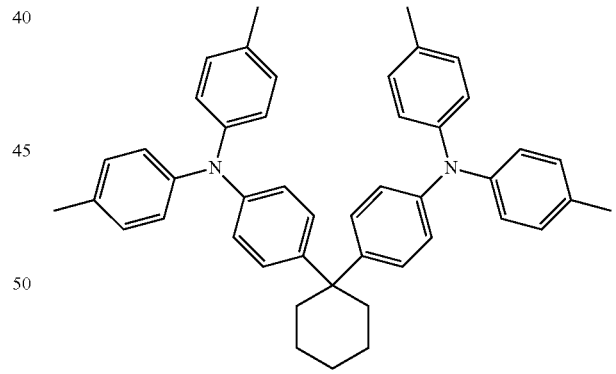
NPB
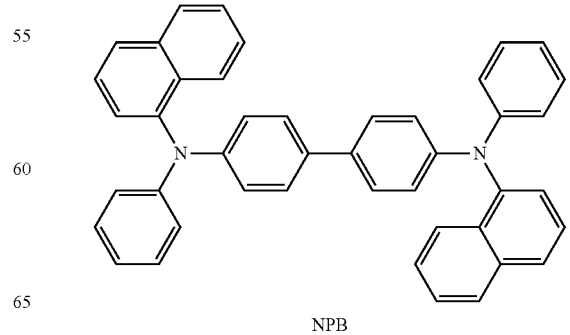

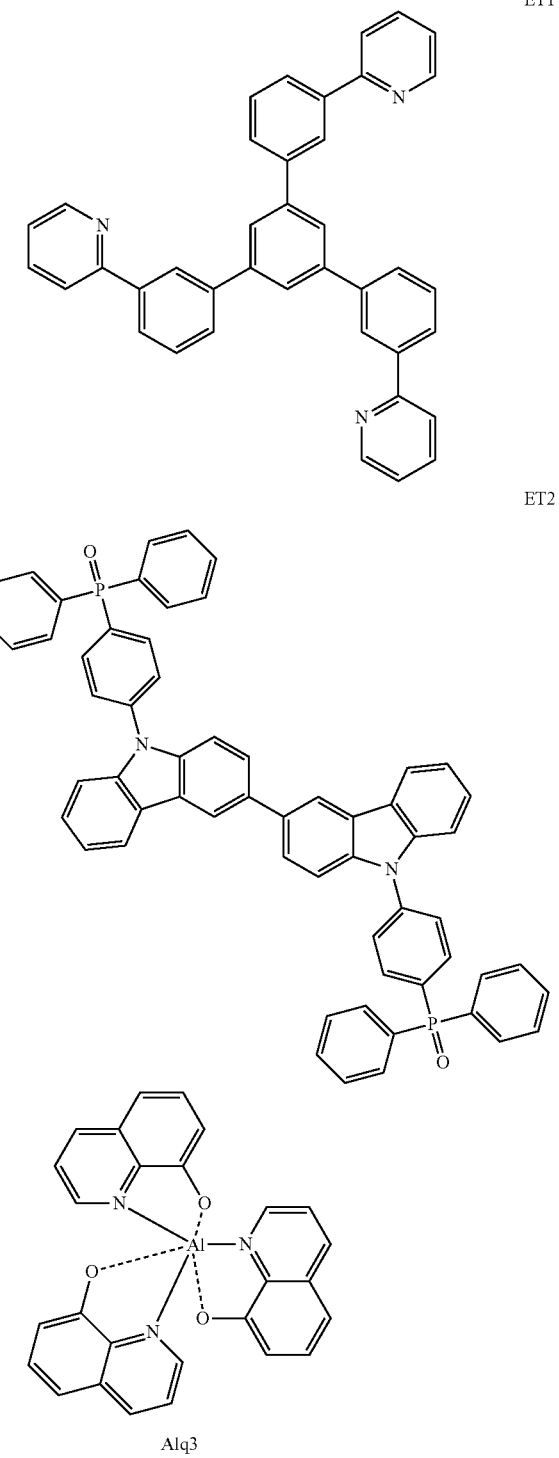

Comparison Between Examples and Comparative Examples

The energy levels of the compounds used as materials for forming the emission layer are compared as shown in Table 1 below.

TABLE 1

| | Host | | | Dopant | | | | |
|---|---|---|---|---|---|---|---|---|
| | IP | EA | $T_1$ | IP | EA | $T_1$ | ΔIP | ΔEA |
| Example 1 | 5.98 | 2.39 | 2.63 | 5.6 | 2.8 | 2.65 | 0.38 | 0.41 |
| Example 2 | 5.84 | 2.21 | 2.64 | 5.6 | 2.8 | 2.65 | 0.24 | 0.59 |
| Example 3 | 6.15 | 2.38 | 2.76 | 5.8 | 3.0 | 2.80 | 0.35 | 0.24 |
| Example 4 | 6.09 | 2.58 | 2.75 | 5.8 | 3.0 | 2.80 | 0.29 | 0.25 |
| Example 5 | 6.00 | 2.40 | 2.80 | 5.8 | 3.0 | 2.80 | 0.20 | 0.20 |
| Example 6 | 6.04 | 2.50 | 2.74 | 5.7 | 3.0 | 2.74 | 0.34 | 0.50 |
| Example 7 | 6.19 | 2.77 | 2.63 | 5.7 | 3.0 | 2.74 | 0.49 | 0.23 |
| Comparative Example 1 | 5.49 | 2.37 | 2.48 | 5.6 | 2.8 | 2.65 | −0.11 | 0.43 |
| Comparative Example 2 | 5.84 | 2.21 | 2.64 | 5.8 | 3.0 | 2.80 | 0.04 | 0.79 |
| Comparative Example 3 | 6.19 | 2.77 | 2.63 | 5.6 | 2.8 | 2.65 | 0.59 | 0.03 |
| Comparative Example 4 | 6.17 | 3.02 | 2.64 | 5.8 | 3.0 | 2.80 | 0.37 | −0.02 |
| Comparative Example 5 | 6.50 | 2.30 | 2.80 | 5.6 | 2.8 | 2.65 | 0.90 | 0.50 |
| Comparative Example 6 | 6.50 | 2.30 | 2.80 | 5.7 | 3.0 | 2.74 | 0.80 | 0.70 |

The characteristics of the organic light-emitting devices of Examples 1 to 7 are shown in Table 2 below, as compared with those of the organic light-emitting devices of Comparative Examples 1 to 9.

TABLE 2

| Organic light-emitting device | HTL adjacent to EML | Host | Dopant | ETL adjacent to EML | Max. EQE | Driving voltage @ 300 nit | Color coordinates @ 300 nit |
|---|---|---|---|---|---|---|---|
| Example 1 | HT1 | PH1 | FIrpic | ET1 | 14.8% | 4.8 V | (0.16, 0.35) |
| Example 2 | HT1 | PH2 | FIrpic | ET1 | 14.2% | 5.1 V | (0.16, 0.35) |

TABLE 2-continued

| Organic light-emitting device | HTL adjacent to EML | Host | Dopant | ETL adjacent to EML | Max. EQE | Driving voltage @ 300 nit | Color coordinates @ 300 nit |
|---|---|---|---|---|---|---|---|
| Example 3 | HT2 | PH3 | FCNIr | ET2 | 8.1% | 4.6 V | (0.14, 0.16) |
| Example 4 | HT2 | PH4 | FCNIr | ET2 | 9.3% | 4.4 V | (0.14, 0.16) |
| Example 5 | HT2 | PH5 | FCNIr | ET2 | 8.7% | 4.7 V | (0.14, 0.16) |
| Example 6 | HT2 | PH6 | FCNIrpic | ET2 | 10.8% | 4.5 V | (0.14, 0.18) |
| Example 7 | HT2 | PH7 | FCNIrpic | ET2 | 11.2% | 4.7 V | (0.14, 0.18) |
| Comparative Example 1 | HT1 | PH8 | FIrpic | ETI | 5.8% | 6.3 V | (0.16, 0.35) |
| Comparative Example 2 | HT2 | PH2 | FCNIr | ET2 | 3.2% | 5.9 V | (0.14, 0.16) |
| Comparative Example 3 | HT1 | PH7 | FIrpic | ET1 | 4.3% | 6.0 V | (0.16, 0.35) |
| Comparative Example 4 | HT2 | PH9 | FCNIr | ET2 | 2.9% | 6.1 V | (0.14, 0.16) |
| Comparative Example 5 | HT1 | PH10 | FIrpic | ET1 | 11.3% | 5.7 V | (0.16, 0.38) |
| Comparative Example 6 | HT2 | PH10 | FCNIrpic | ET2 | 9.8% | 5.7 V | (0.16, 0.20) |
| Comparative Example 7 | NPB | PH1 | FIrpic | ET1 | 3.1% | 8.8 V | (0.16, 0.42) |
| Comparative Example 8 | HT1 | PH1 | FIrpic | Alq3 | 3.4% | 8.2 V | (0.17, 0.39) |
| Comparative Example 9 | NPB | PH1 | FIrpic | Alq3 | 1.8% | 9.3 V | (0.18, 0.40) |

EQE: External Quantum Efficiency

Referring to Tables 1 and 2, based on satisfactory relationships among the hole transporting material, the electron transporting material, and the host and the dopant of the emission layer, it may be that the organic light-emitting device according to Examples 1 to 7 exhibited excellent emission characteristics, as compared with those of Comparative Examples 1 to 9.

By way of summation and review, when an organic light-emitting device uses a phosphorescent luminescent material, such an organic light-emitting device may be manufactured as a device having higher light emission efficiency than a device using a fluorescent material. A phosphorescent luminescent material may be suitable in terms of light emission characteristics, but in order to ideally achieve high light emission efficiency, efficiently confining energy in an emission layer in which the energy is excited may be desirable.

Thus, in order to help prevent diffusion of triplet excitons, which have a longer lifespan than that of single excitons, to the outside of the emission layer and to achieve high light emission efficiency, a material having a high triplet energy $T_1$ may be used in a layer that is adjacent to the emission layer.

In addition, in order to efficiently emit the triplet excitons from a dopant, a phosphorescent host may have a greater triplet energy $T_1$ than that of a dopant. However, in this regard, a host molecule may increase an energy gap, and accordingly, the host molecule may have a high ionization potential IP and a low electron affinity EA.

In this regard, there may be a hindrance to carrier injection to the host, and the organic light-emitting device may increase driving voltage, decrease light emission efficiency, and accordingly, degrade light emission lifespan.

For example, in order to use a phosphorescent dopant (having a relationship of $T_1 \geq 2.7$ eV) having a color coordination of CIEy<0.20 in developing a blue phosphorescent device, a material that has a greater triplet energy $T_1$ than that of the phosphorescent dopant may be employed as a phosphorescent host material.

Here, a material with a wide band gap may be suitable as a host. However, an organic compound having a wide gap between a single energy $S_1$ and a triplet energy $T_1$ may not be suitable as a host, e.g., because a carrier injection barrier of the organic compound may be increased.

In addition, based on the characteristics of a material with a wide band gap, the material may be limitedly designed to reduce a conjugation length thereof, and accordingly, introduction of beneficial substituents may be restricted therewith. The embodiments complement the restriction and suggest a configuration that facilitates the carrier injection and decreases driving voltage of the organic light-emitting device.

The embodiments may provide an organic light-emitting device capable of preventing a decrease in light emission efficiency and light emission lifespan.

As described above, in an organic light-emitting device according to an embodiment, electrons provided from a negative electrode and holes provided from a positive electrode may be recombined in an emission layer to produce excitons. The organic light-emitting device may be capable of preventing the occurrence of leakage current that may otherwise be caused by the holes or the electrons leaking to a layer that is adjacent to the emission layer, and accordingly, may also capable be of preventing a decrease in light emission efficiency and light emission lifespan.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light-emitting device, comprising:
a first electrode;
a second electrode facing the first electrode; and
an organic layer between the first electrode and the second electrode, the organic layer including:
an emission layer,
a hole transport region between the first electrode and the emission layer, the hole transport region including at least one of a hole transport layer, a hole injection layer, and a buffer layer, and
an electron transport region between the emission layer and the second electrode, the electron transport region including at least one of a hole blocking layer, an electron transport layer, and an electron injection layer,
wherein the emission layer includes at least one host (H) and at least one phosphorescent dopant (D), an electron affinity (EA) and an ionization potential (IP) simultaneously satisfying the relationships represented by Equation (1) and Equation (2) below:

$$EA(D)-EA(H) \geq 0.2 \text{ eV} \quad (1)$$

$$IP(H)-IP(D) \geq 0.2 \text{ eV} \quad (2), \text{ and}$$

wherein the hole transport region and the electron transport region each include a layer that is adjacent to the emission layer and that includes a material having a triplet energy ($T_1$) that is greater than that of the phosphorescent dopant,
wherein the electron transport region includes the electron transport layer, and
wherein the material having the triplet energy that is greater than that of the phosphorescent dopant of the electron transport region:
is included in the electron transport layer, and
includes a carbazole moiety or is Compound ET1, below,

ET1

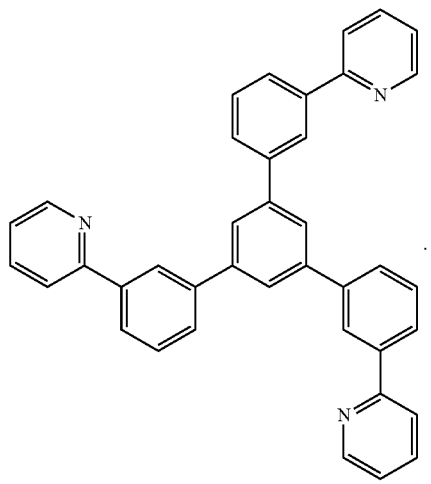

2. The organic light-emitting device as claimed in claim 1, wherein the hole transport region includes the hole transport layer adjacent to the emission layer, the hole transport layer including the material having the triplet energy that is greater than that of the phosphorescent dopant.

3. The organic light-emitting device as claimed in claim 1, wherein:
the hole transport region includes the hole transport layer, and
the material having the triplet energy that is greater than that of the phosphorescent dopant of the hole transport region:
includes a carbazole moiety, and
is included in the hole transport layer.

4. The organic light-emitting device as claimed in claim 1, wherein the host (H) and the phosphorescent dopant (D) of the emission layer have a triplet energy ($T_1$) that satisfies a relationship represented by Equation (3) below:

$$T_1(D)-T_1(H) \leq 0.3 \text{ eV} \quad (3).$$

5. The organic light-emitting device as claimed in claim 1, wherein the host (H) of the emission layer has an electron affinity EA and an ionization potential (IP) satisfying a relationship represented by Equation (4) below:

$$IP(H)-EA(H) \leq 3.8 \text{ eV} \quad (4).$$

6. The organic light-emitting device as claimed in claim 1, wherein the host of the emission layer is a compound represented by Formula 1 below:

<Formula 1>

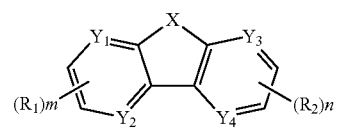

wherein, in Formula 1,
X is selected from $CR_3R_4$, $NR_5$, S, and O,
$Y_1$ to $Y_4$ are each independently selected from $CR_6$ and N,
$R_1$ to $R_6$ are each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_2$-$C_{60}$ heteroaryl group, a substituted or unsubstituted monovalent non-aromatic condensed polycyclic group, and a substituted or unsubstituted monovalent non-aromatic condensed heteropolycyclic group;
at least one substituent of the substituted $C_1$-$C_{60}$ alkyl group, the substituted $C_3$-$C_{10}$ cycloalkyl group, the substituted $C_2$-$C_{10}$ heterocycloalkyl group, the substituted $C_3$-$C_{10}$ cycloalkenyl group, the substituted $C_2$-$C_{10}$ heterocycloalkenyl group, the substituted $C_6$-$C_{60}$ aryl group, the substituted $C_2$-$C_{60}$ heteroaryl group, the substituted monovalent non-aromatic condensed polycyclic group, and the substituted monovalent non-aromatic condensed heteropolycyclic group is selected from:
a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), and —B($Q_{16}$)($Q_{17}$);

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, and a monovalent non-aromatic condensed heteropolycyclic group, each substituted with at least one of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), and —B($Q_{26}$)($Q_{27}$); and —N($Q_{31}$)($Q_{32}$), —Si($Q_{33}$)($Q_{34}$)($Q_{35}$), and —B($Q_{36}$)($Q_{37}$), wherein $Q_{11}$ to $Q_{17}$, $Q_{21}$ to $Q_{27}$ and $Q_{31}$ to $Q_{37}$ are each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_2$-$C_{60}$ heteroaryl group, a monovalent non-aromatic condensed polycyclic group, and a monovalent non-aromatic condensed heteropolycyclic group, and m and n are each independently integers of 1 to 4, and in the case of m or n being 2 or more, the 2 or more of $R_1$ or $R_2$ are identical to or different from each other.

7. The organic light-emitting device as claimed in claim 6, wherein adjacent substituents or ones of $R_1$ and $R_2$ are bound to each other to form a ring.

8. The organic light-emitting device as claimed in claim 1, wherein a host material in the emission layer includes any one of the following Compounds PH1 to PH7:

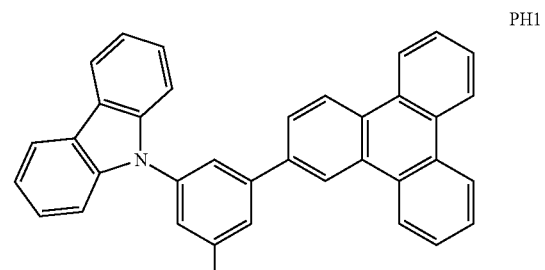

PH1

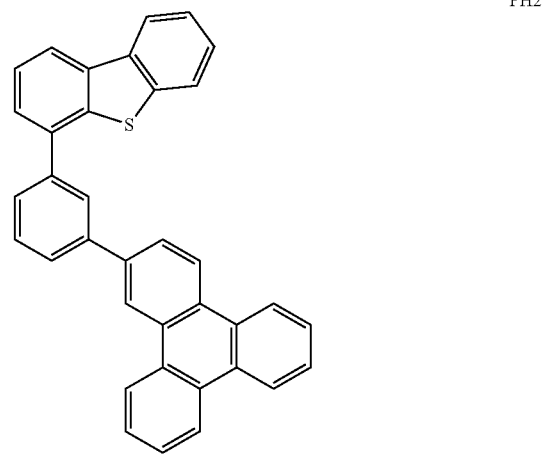

PH2

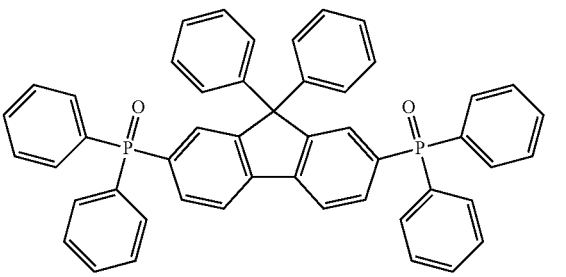

PH3

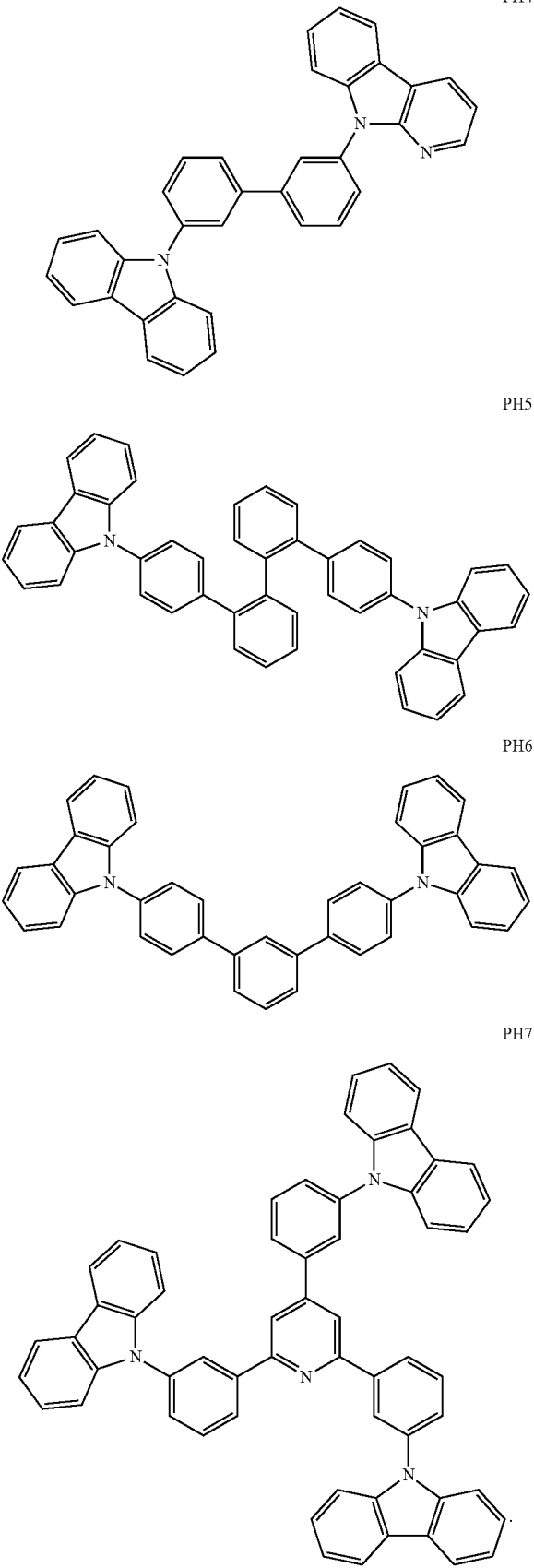

PH4

PH5

PH6

PH7

9. The organic light-emitting device as claimed in claim 1, wherein the dopant in the emission layer includes an iridium complex.

10. The organic light-emitting device as claimed in claim 1, wherein the dopant in the emission layer includes any one of the following compounds:

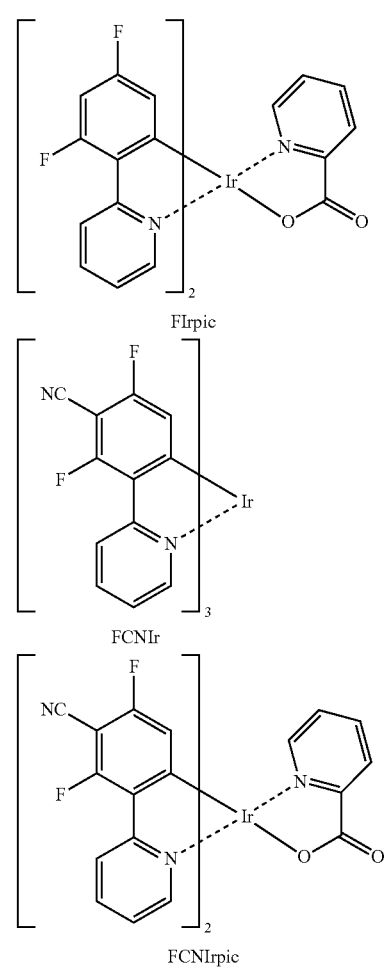

11. The organic light-emitting device as claimed in claim 1, wherein the hole transport region includes the hole transport layer and the material having the triplet energy that is greater than that of the phosphorescent dopant is included in the hole transport layer and is represented by Formula 2 below:

<Formula 2>

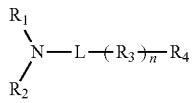

wherein, in Formula 2, $R_1$, $R_2$, and $R_4$ are each independently selected from a hydrogen, a deuterium, —F, —Br, —I, a cyano group, a substituted or unsubstituted $C_6$-$C_{60}$ arylamino group, a substituted or unsubstituted $C_1$-$C_{60}$ alkyl group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group;

$R_3$ and L are each independently selected from a substituted or unsubstituted $C_3$-$C_{10}$ cycloalkylene group, a substituted or unsubstituted $C_2$-$C_{10}$ heterocycloalkylene group, a substituted or unsubstituted $C_3$-$C_{10}$ cycloalkenylene group, a substituted or unsubstituted $C_2$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group;

adjacent substituents or ones of $R_1$ to $R_4$ are separate or are bonded to each other to form a ring; and n is an integer of 1 to 3, and in the case of n being 2 or greater, each $R_3$ is identical to or different from each other.

12. The organic light-emitting device as claimed in claim 1, wherein the material having the triplet energy that is greater than that of the phosphorescent dopant included in the electron transport layer is represented by any one of Formulae 3 and 4:

$(A_{21})_{n21}$-$(A_{22})_{n22}$-$(A_{23})_{n23}$-$(A_{24})_{n24}$ <Formula 3> wherein, in Formula 3, $A_{21}$ and $A_{24}$ are each independently selected from a substituted or unsubstituted $C_6$-$C_{60}$ aryl group and a substituted or unsubstituted $C_1$-$C_{60}$ heteroaryl group;

$A_{22}$ and $A_{23}$ are each independently from a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group;

at least one of $A_{21}$ to $A_{24}$ is selected from a substituted or unsubstituted nitrogen atom-containing $C_1$-$C_{60}$ heteroaryl or heteroarylene group;

n21 to n24 are each independently selected from 0, 1, 2, and 3; and a sum of n21, n22, n23, and n24 is 4 or greater,

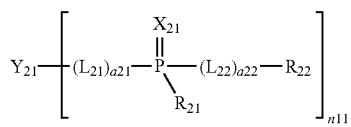

<Formula 4> wherein, in Formula 4, $L_{21}$ and $L_{22}$ are each independently selected from a substituted or unsubstituted $C_1$-$C_{10}$ alkylene group, a substituted or unsubstituted silylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group;

a21 and a22 are each independently integers selected from 0 to 3, and in the case of a21 or a22 being 2 or greater, each of $L_{21}$ or $L_{22}$ are identical to or different from each other;

$R_{21}$ and $R_{22}$ are each independently selected from a hydrogen, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group;

$X_{21}$ is selected from an oxygen atom, a sulfur atom, and a selenium atom;

$Y_{21}$ is selected from a single bond, a substituted or unsubstituted $C_6$-$C_{60}$ aryl group, a substituted or unsubstituted $C_6$-$C_{60}$ arylene group, a substituted or unsubstituted $C_1$-$C_{60}$ heteroaryl group, and a substituted or unsubstituted $C_1$-$C_{60}$ heteroarylene group; and n11 is selected from 1, 2, and 3, provided that at least one of $Y_{21}$, $L_{21}$, $L_{22}$, $R_{21}$, and $R_{22}$ includes the carbazole moiety.

13. The organic light-emitting device as claimed in claim 1, wherein the hole transport region includes the hole transport layer and the material having the triplet energy that is greater than that of the phosphorescent dopant is included in the hole transport layer and is one of Compound HT1 or Compound 1-112, below:

HT1

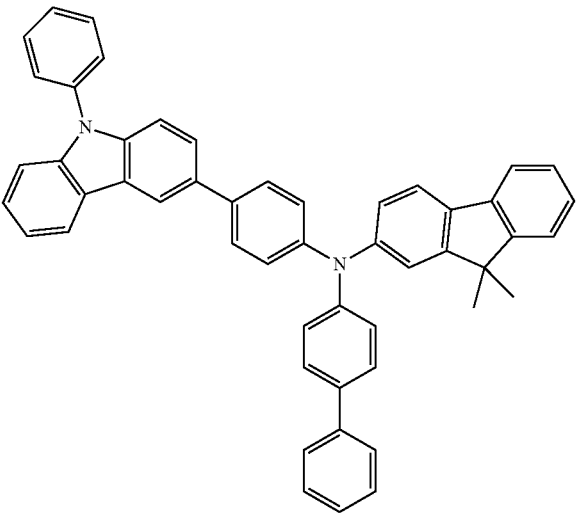

-continued

HT2

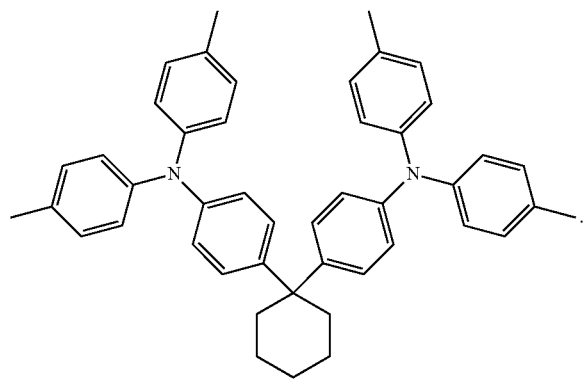

14. The organic light-emitting device as claimed in claim 1, wherein the material having the triplet energy that is greater than that of the phosphorescent dopant included in the electron transport layer is one of Compound ET1 or Compound ET2, below:

ET1

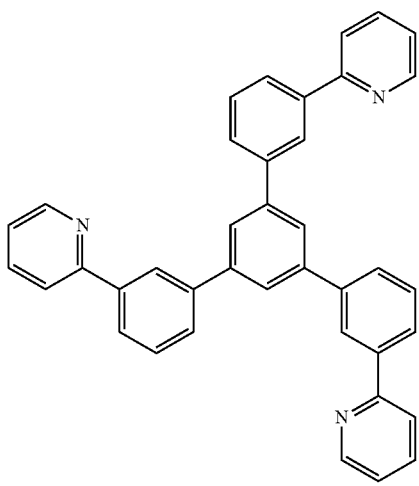

-continued

ET2

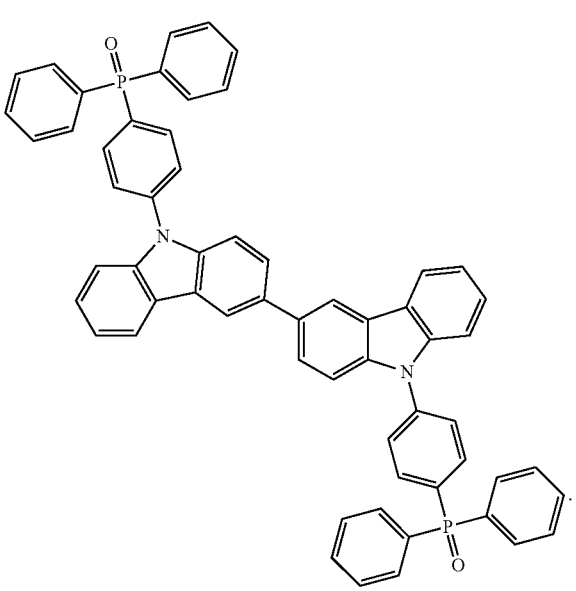

15. The organic light-emitting device as claimed in claim 1, wherein the electron transport region includes a metal complex.

16. The organic light-emitting device as claimed in claim 15, wherein the metal complex includes a lithium complex.

17. The organic light-emitting device as claimed in claim 1, wherein the organic layer is formed by a wet process.

18. A flat display apparatus, comprising:
   a source electrode;
   a drain electrode; and
   the organic light-emitting device as claimed in claim 1,
   wherein the first electrode of the organic light-emitting device is electrically connected to the source electrode or the drain electrode.

* * * * *